(12) United States Patent
Asayama et al.

(10) Patent No.: US 7,948,415 B2
(45) Date of Patent: May 24, 2011

(54) DA CONVERTER, AD CONVERTER, AND SEMICONDUCTOR DEVICE

(75) Inventors: Go Asayama, Kanagawa (JP); Noriyuki Fukushima, Kanagawa (JP); Yoshikazu Nitta, Tokyo (JP); Yoshinori Muramatsu, Kanagawa (JP); Kiyotaka Amano, Tokyo (JP)

(73) Assignee: Sony Corporation, Tokyo (JP)

( * ) Notice: Subject to any disclaimer, the term of this patent is extended or adjusted under 35 U.S.C. 154(b) by 430 days.

(21) Appl. No.: 12/207,283

(22) Filed: Sep. 9, 2008

(65) Prior Publication Data

US 2009/0009641 A1 Jan. 8, 2009

Related U.S. Application Data

(63) Continuation of application No. 11/506,989, filed on Aug. 18, 2006, now Pat. No. 7,423,570.

(30) Foreign Application Priority Data

Aug. 22, 2005 (JP) ................................. 2005-239686

(51) Int. Cl.
*H03M 1/66* (2006.01)
(52) U.S. Cl. ........................................ 341/144; 341/139

(58) Field of Classification Search .................. 341/144, 341/139, 155
See application file for complete search history.

(56) References Cited

U.S. PATENT DOCUMENTS

| 5,953,123 | A | 9/1999 | Jaklitsch et al. |
|---|---|---|---|
| 6,304,139 | B1 | 10/2001 | Kanno |
| 6,563,388 | B2 | 5/2003 | Masenas et al. |
| 6,868,262 | B2 | 3/2005 | Gonya, Jr. |

FOREIGN PATENT DOCUMENTS

| JP | 61-295722 | 12/1986 |
|---|---|---|
| JP | 01-293011 | 11/1989 |
| JP | 06-132828 | 5/1994 |
| JP | 2000-152082 | 5/2000 |
| JP | 2001-125734 | 5/2001 |
| JP | 2001-267926 | 9/2001 |
| JP | 2002-232291 | 8/2002 |
| JP | 2002-007984 | 1/2004 |

*Primary Examiner* — Peguy JeanPierre
(74) *Attorney, Agent, or Firm* — Robert J. Depke; Rockey, Depke & Lyons, LLC

(57) ABSTRACT

A DA converter includes a first DA conversion section for obtaining an analog output signal in accordance with a digital input signal value, and a second DA conversion section for obtaining an analog gain control output signal in accordance with a digital gain control input signal value. In the DA converter, the gain control of the analog output signal generated by the first DA conversion section is performed on the basis of the gain control output signal generated by the second DA conversion section.

1 Claim, 12 Drawing Sheets

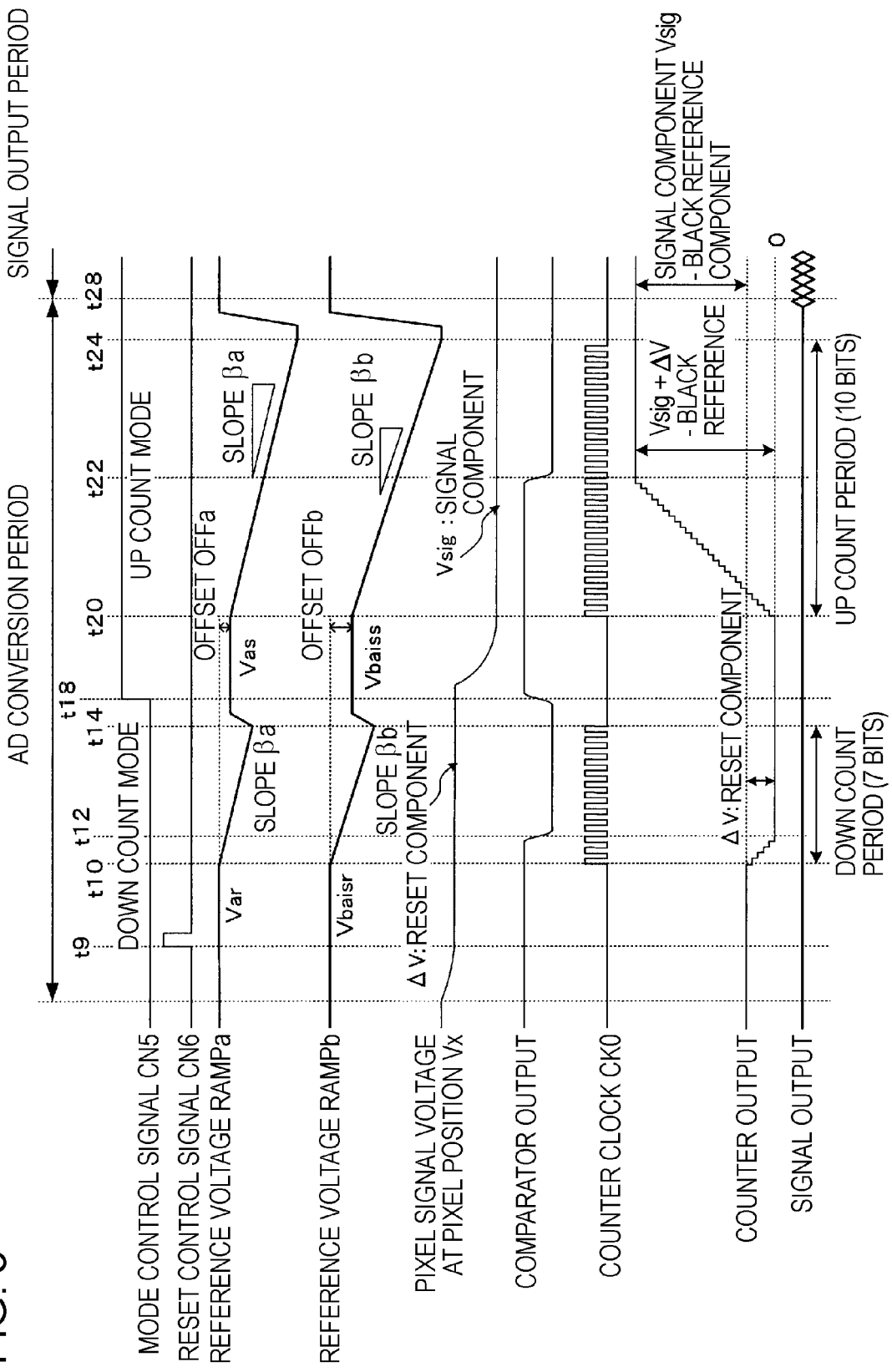

DA CONVERTER, AD CONVERTER, AND SEMICONDUCTOR DEVICE

CROSS REFERENCES TO RELATED APPLICATIONS

The subject matter of application Ser. No. 11/506,989, is incorporated herein by reference. The present application is a Continuation of U.S. Ser. No. 11/506,989, filed Aug. 18, 2006, now U.S. Pat. No. 7,423,570, issued Sep. 9, 2008, which claims priority to Japanese Patent Application JP 2005-239686 filed in the Japanese Patent Office on Aug. 22, 2005, the entire contents of all are incorporated herein by reference.

BACKGROUND OF THE INVENTION

1. Field of the Invention

The present invention relates a DA (Digital-to-Analog) converter for converting a digital signal into an analog signal, an AD converter including the DA converter, and a semiconductor device such as an imaging device, etc. The present invention relates to, for example, a mechanism of a DA conversion using a current-source cell matrix having an array of cells arranged in a matrix.

2. Description of the Related Art

DA converters for converting a digital signal into an analog signal are used in various ways in electronic apparatuses, for example, cameras or cell phones, or in semiconductor devices.

For example, a semiconductor device for detecting a physical-quantity distribution, in which a plurality of unit components (for example, pixels) having sensitivity to electromagnetic waves input from the outside, such as light, radiation rays, etc., are arranged in line or in a matrix, are used in various fields.

For example, in the field of video apparatuses, solid-state imaging devices of a CCD (Charge Coupled Device) type, a MOS (Metal Oxide Semiconductor) type, and a CMOS (Complementary Metal-Oxide Semiconductor) type, which detect light (an example of an electromagnetic wave) among physical quantities, are used. These imaging devices read out a physical-quantity distribution converted into an electronic signal by a unit component (a pixel in the case of a solid-state imaging device) as an electronic signal. Here, "solid-state" means that the device is made of a semiconductor.

Also, solid-state imaging devices include an amplified solid-state imaging device including a pixel having the configuration of an amplified solid-state imaging element (also called APS; Active Pixel Sensor/gain cell), which has a transistor for amplification in a pixel-signal generation section for generating a pixel signal in accordance with signal charge generated by a charge-generation section. For example, most of CMOS imaging devices have such a configuration.

In such an amplified solid-state imaging device, in order to read out a pixel signal to the outside, address control is performed on a pixel section in which a plurality of unit pixels are arranged, and the signal is arbitrarily selected to be read out from individual unit pixel. That is to say, an amplified solid-state imaging device is one example of solid-state imaging devices of an address control type.

For example, in an amplified solid-state imaging device, which is a kind of X-Y addressing-type solid-state imaging device, pixels are composed of active devices having a MOS structure, etc., (MOS transistors) in order to have an amplification function in pixels themselves. Specifically, signal electric charge (photo electrons) stored in a photodiode, which is a photoelectric transfer device, is amplified by the active device, and is read out as image information.

In an X-Y addressing-type solid-state imaging device, for example, a large number of pixel transistors are arranged in a two-dimensional matrix to constitute a pixel area. The storage of signal electric charge corresponding to incident light is started for each line (row) or for each pixel. The signal of electric current or voltage based on the stored signal electric charge is read out in sequence from each pixel by addressing. Here, in a MOS (including CMOS) type, a method, in which pixels of one row is accessed simultaneously, the pixel signals are read out from the pixel section for each row, and are output to the outside, is often used. Also, a method, in which analog pixel signals read out from the pixel section are converted into digital signals using an analog-to-digital converter (AD converter) and then are output to the outside, is sometimes employed (for example, Japanese Unexamined Patent Application Publication Nos. 2000-152082 and 2002-232291).

As described in Japanese Unexamined Patent Application Publication Nos. 2000-152082 and 2002-232291, there are various kinds of AD conversion methods in terms of a circuit size, a processing speed, a resolution, etc. Among them, there is an AD conversion method of a so-called single-slope integration type or a ramp-signal comparison type, in which a comparison is made between an analog unit signal and a reference signal changing uniformly for the conversion into a digital signal, count processing is performed concurrently with the comparison processing, and the digital signal of the unit signal is obtained on the basis of the count value at the time of completion of the comparison processing. Thus, in order to generate the reference signal changing uniformly, a DA converter is sometimes used.

SUMMARY OF THE INVENTION

At the same time, in an AD conversion method of a so-called single-slope integration type, it is possible to obtain digital data as a result of gain adjustment on the analog signal to be subjected to AD conversion processing by changing the slope of the reference signal supplied to the comparison circuit. The adjustment precision of the slope of the reference signal is related to the adjustment precision of the gain adjustment on the analog signal. Thus, when high-precision gain adjustment is necessary, high-precision adjustment on the change rate of the reference signal becomes necessary.

In order to adjust the change rate of the reference signal, for example the reference signal generated at a reference change rate as DA conversion output is considered to be subjected to analog gain adjustment using an analog amplifier. However, it is difficult to adjust analog gain in terms of precision. For example, it is difficult to perform fine adjustment with a precision of 12 bits or more, or to reduce variations of the reference voltage.

The present invention has been made in view of the above-described circumstances. It is desirable to provide a mechanism capable of adjusting the gain of a DA conversion output with high precision. For example, it is desirable to provide a mechanism which allows to adjust the slope of the reference signal with high precision when a reference signal changing uniformly in a constant direction and being used for an AD conversion method of a so-called single-slope integration type is obtained as a DA conversion output.

According to an embodiment of the present invention, there is provided a DA converter including: a first DA conversion section for obtaining an analog output signal in accordance with a digital input signal value; and a second DA conversion section for obtaining an analog gain control output signal in accordance with a digital gain control input signal value, wherein gain control of the analog output signal generated by the first DA conversion section is performed on the basis of the gain control output signal generated by the second DA conversion section.

That is to say, the gain control is performed on the first DA conversion section obtaining the analog output on the basis of the gain-control output signal obtained by the second DA conversion section. The gain of the analog output signal generated by the first DA conversion section is adjusted by the digital control, and thus it becomes possible to achieve high-precision adjustment easily. When the reference signal to be used in the single-slope integration type AD conversion method is generated by the first DA conversion section as an analog output signal, it is possible to adjust the slope of the reference signal. Thus, as a result, the gain control can be performed on the analog signal to be subjected to AD conversion processing.

In this regard, it is preferable to employ the configuration of a current-output type DA conversion circuit both to the first and the second DA conversion section.

In particular, the first DA conversion section should employ a configuration in which digital input is divided into upper bits and lower bits for selectively controlling the current-source cells. Thus, the upper current-source cell section, which is selectively controlled by the upper bit controller, is provided with a plurality of the upper current-source cells outputting the same constant current, and the lower current-source cell section, which is selectively controlled by the lower bit controller, is provided with a plurality of the lower current-source cells outputting bit-weighted current.

Here, the lower bit controller generates, as bit data, a frequency division clock for dividing by a power of two using a divider which performs a frequency division operation on the basis of the input count clock. The lower bit controller selects a lower current-source cell weighted by a corresponding current value using the frequency division clock (namely, the bit data) as the selection control signal. Also, the upper bit controller activates in sequence shift outputs of the shift registers using a signal indicating a carry or a borrow in the frequency division operation of the lower bit controller, and selects the upper current-source cell using the shift output as a selection control signal.

The lower bit controller performs frequency division operations on the basis of the count clock, and the upper bit controller performs shift operations using a signal indicating a carry or a borrow produced by the dividing operations. Thus, the lower bit controller and the upper bit controller perform coordinated (synchronized) operations rather than independent operations. Also, the upper bit controller can reliably select a current-source cell corresponding to the next bit data.

According to the present invention, the gain control is performed on the first DA conversion section obtaining the analog output on the basis of the gain-control output signal obtained by the second DA conversion section. The precision of the gain-control output signal generated by the second DA conversion section depends on the precision of the digital gain-control input signal. However, the digital gain-control input signal can be controlled by a digital value, and thus, for example, it is possible to achieve higher precision by increasing the number of bits of the digital gain-control input signal.

According to another embodiment of the present invention, there is provided an AD converter including: a reference-signal generation section for generating a reference signal for converting an analog signal into a digital signal; a comparison section for comparing the analog signal and the reference signal generated by the reference-signal generation section; and a counter section for performing count processing with a predetermined count clock concurrently with comparison processing by the comparison section and holding a count value at the point in time of completion of the comparison processing by the comparison section, wherein the reference-signal generation section includes a first DA conversion section for obtaining the reference signal in accordance with a value of a digital input signal and a second DA conversion section for obtaining an analog gain control output signal in accordance with a value of a digital gain control input signal, and a gain of the reference signal generated by the first DA conversion section is adjusted on the basis of the gain control output signal generated by the second DA conversion section.

According to another embodiment of the present invention, there is provided a semiconductor device for detecting a physical-quantity distribution, the semiconductor device including: an effective area including an electric-charge generation section for generating electric charge corresponding to incident electromagnetic wave and a unit-signal generation section for generating an analog unit signal corresponding to the electric charge generated by the electric-charge generation section in a unit component; a reference-signal generation section for generating a reference signal for converting the unit signal into a digital signal as a functional element for converting the unit signal into a digital signal; a comparison section for comparing the unit signal and the reference signal generated by the reference-signal generation section; and a counter section for performing count processing with a predetermined count clock concurrently with comparison processing by the comparison section and holding a count value at the point in time of completion of the comparison processing by the comparison section, wherein the reference-signal generation section includes a first DA conversion section for obtaining the reference signal in accordance with a value of a digital input signal and a second DA conversion section for obtaining an analog gain control output signal in accordance with a value of a digital gain control input signal, and a gain of the reference signal generated by the first DA conversion section is adjusted on the basis of the gain control output signal generated by the second DA conversion section.

According to another embodiment of the present invention, there is provided an electronic apparatus including: an imaging section including an effective area including an electric-charge generation section for generating electric charge corresponding to incident electromagnetic wave and a unit-signal generation section for generating an analog unit signal corresponding to the electric charge generated by the electric-charge generation section in a unit component, a reference-signal generation section for generating a reference signal for converting the unit signal into a digital signal, a comparison section for comparing the unit signal and the reference signal generated by the reference-signal generation section, and a counter section for performing count processing with a predetermined count clock concurrently with comparison processing by the comparison section and holding a count value at the point in time of completion of the comparison processing by the comparison section; and a signal-processing circuit section for performing processing on the signal read from the imaging section, wherein the reference-signal generation section includes a first DA conversion section for obtaining the reference signal in accordance with a value of a digital input signal value and a second DA conversion section for obtaining an analog gain control output signal in accordance with a value of a digital gain control input signal, and a gain of the reference signal generated by the first DA conversion section is adjusted on the basis of the gain control output signal generated by the second DA conversion section.

BRIEF DESCRIPTION OF THE DRAWINGS

FIG. 3 is a timing chart for illustrating signal capturing differential processing which is a basic operation in a column AD circuit of the solid-state imaging device shown in FIG. 1;

DESCRIPTION OF THE PREFERRED EMBODIMENTS

In the following, a detailed description will be given of an embodiment of the present invention with reference to the drawings. In this regard, a description will be given, in the below, of the case where the present invention is applied to a CMOS imaging device, which is an example of a solid-state imaging device of an X-Y addressing type. Also, a description will be given assuming that a CMOS imaging device includes all the pixels made of NMOSs or PMOSs.

However, this is only an example, and the device to be the target is not limited to a MOS imaging device. All the embodiments described below can be applied in the same manner to all semiconductor devices for detecting a physical-quantity distribution, in which a plurality of unit components having sensitivity to electromagnetic waves input from the outside, such as light, radiation rays, etc., are arranged in line or in a matrix.

Structure of Solid-State Imaging Device

Figure 1:
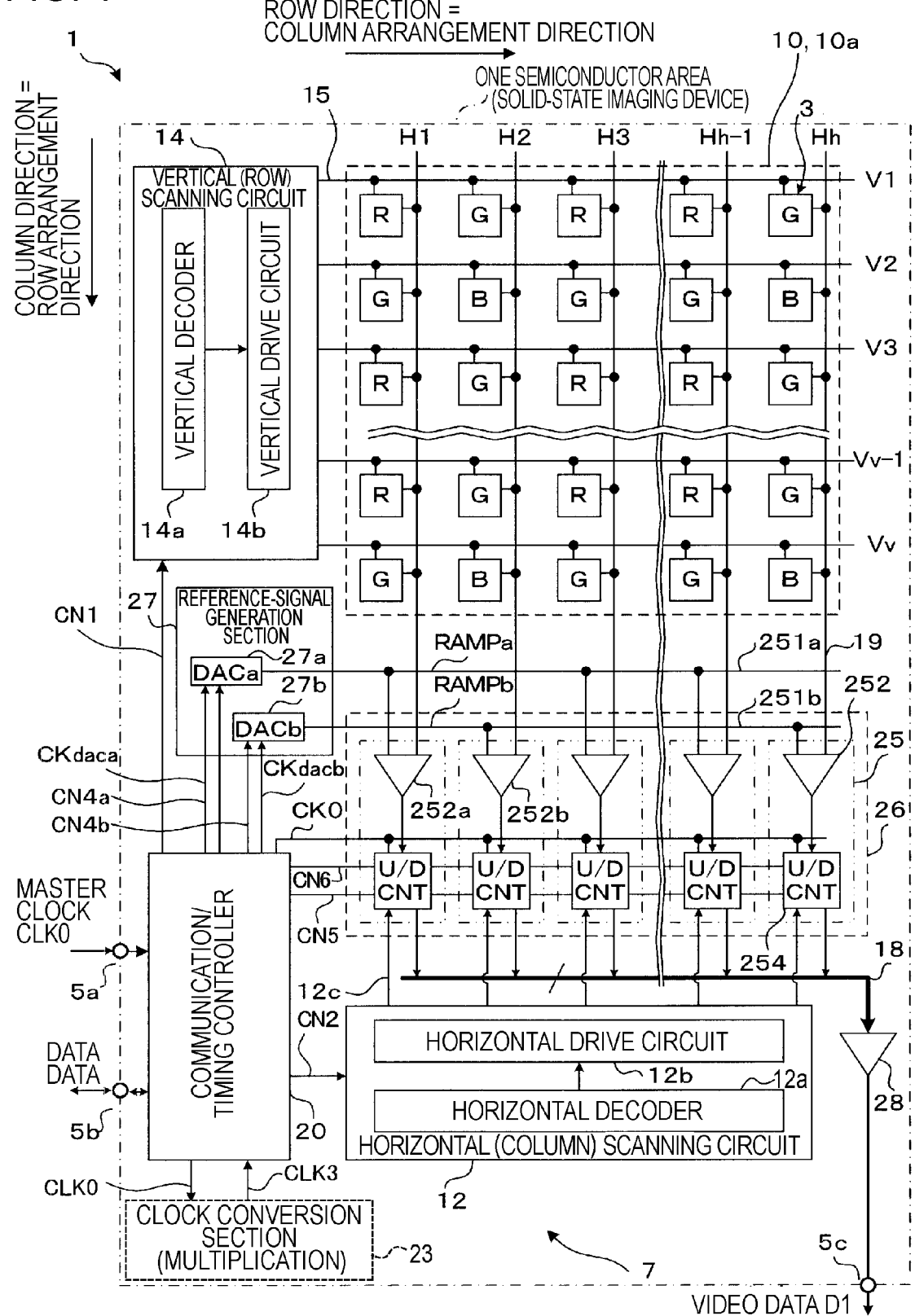
FIG. 1 is a schematic configuration diagram of a CMOS imaging device, which is a semiconductor device, according to an embodiment of the present invention.

FIG. 1 is a schematic configuration diagram of a CMOS imaging device (CMOS image sensor), which is a semiconductor device, according to an embodiment of the present invention. In this regard, this CMOS imaging device is one form of a semiconductor device or an electronic apparatus.

The solid-state imaging device 1 has a pixel area in which a plurality of pixels including a light receiving element (an example of an electric-charge generation section) for outputting a signal in accordance with incident light amount are arranged in rows and columns (that is to say, in a two-dimensional matrix). The solid-state imaging device 1 is a device in which a signal output from each pixel is a voltage signal, and CDS (Correlated Double Sampling) processing function sections and digital conversion sections (ADC; Analog-to-Digital Converters) are disposed in parallel with the columns.

"CDS processing function sections and digital conversion sections are disposed in parallel with the columns" means that a plurality of the CDS processing function sections and the digital conversion sections are disposed virtually in parallel with vertical signal lines 19 of the vertical columns. When viewed in a plan view, both of a plurality of the individual function sections may be disposed only at one of the edge sides (the output side disposed at the lower side of the figure) in the column direction with respect to a pixel section (imaging section) 10. Alternatively, a plurality of the individual function sections may be disposed by being divided into one of the edge sides (the output side disposed at the lower side of the figure) in the column direction with respect to a pixel section 10 and the other of the edge sides (the upper side in the figure). In the latter case, horizontal scanning sections for performing read scanning (horizontal scanning) in the row direction should be disposed by being divided into each of the edge sides, and should be allowed to operate individually.

A typical example in which the CDS processing function sections and the digital conversion sections are disposed in parallel with the columns is a device of a column type, in which the CDS processing function sections and the digital conversion sections are disposed for each vertical column and being read out in sequence. Also, the configuration is not limited to the column type. A configuration in which one CDS processing function section and one digital conversion section are assigned to a plurality of (for example, two) adjacent vertical signal lines 19 (vertical columns) may be employed. Also, a configuration in which one CDS processing function section and one digital conversion section are assigned to N vertical signal lines 19 (vertical columns) at the intervals of N lines (N is a positive integer; N−1 lines are disposed in-between) may be employed.

With the exception of the column type, in any configuration, a plurality of vertical signal lines 19 (vertical columns) commonly use one CDS processing function section and one digital conversion section. Thus, a switching circuit (switch) for supplying the pixel signals for a plurality of columns, which are supplied from the pixel section 10, to one CDS processing function section and one digital conversion section is disposed. In this regard, depending on the processing of the subsequent stage, it becomes necessary to dispose a memory for holding the output signals.

In any way, the signal processing of each pixel signal is performed after reading out the signal for each pixel column by employing the configuration in which one CDS processing function section and one digital conversion section are assigned to a plurality of vertical signal lines 19 (vertical columns). Thus, it is possible to simplify the configuration in each unit pixel, to increase the number of pixels in the image sensor, to reduce the size, to reduce the cost, etc., compared with the configuration of performing the same signal processing in each unit pixel.

Also, it is possible to concurrently perform parallel processing on pixel signals for one row by a plurality of signal processing sections disposed in parallel with columns. Thus, it is possible to operate the signal processing section at a low speed compared with the case of performing processing by one CDS processing function section and one digital conversion section at the output circuit side or the outside of the device. Accordingly, there are advantages in power consumption, band performance, noise, etc. On the contrary, if the power consumption, the band performance, etc., are the same, it becomes possible for the entire sensor to perform a high-speed operation.

In this regard, in the case of the column-type configuration, there are advantages in that the device can be operated at a low speed, advantages in power consumption, band performance, noise, etc., and advantages in that a switching circuit (switch) is not necessary. In the following embodiment, a description will be given of the case of the column-type configuration unless otherwise mentioned.

As shown in FIG. 1, the solid-state imaging device 1 includes a pixel area (imaging section) 10 in which a plurality of unit pixels 3 being substantially square in shape are arranged in rows and columns (that is to say, in a tetragonal lattice), a drive controller 7 disposed at the outside of the pixel area 10, a column processing section 26, a reference-signal generation section 27 which supplies a reference signal for AD conversion to the column processing section 26, and an output circuit 28.

In this regard, it is possible to dispose an AGC (Auto Gain Control) circuit having a signal-amplification function, etc., as necessary at the preceding stage or the subsequent stage of the column processing section 26 in the same semiconductor area as the column processing section 26. When the AGC is performed at the preceding stage of the column processing section 26, analog amplification is performed. Whereas the AGC is performed at the subsequent stage of the column processing section 26, digital amplification is performed. If n-bit digital data is simply amplified, the grayscale might be lost, and thus performing analog amplification first and then performing digital conversion is considered to be rather preferable.

The drive controller 7 includes a control circuit function for reading out the signal of the pixel area 10 in sequence. For example, the drive control section 7 includes, for example, a horizontal scanning circuit (column scanning circuit) 12 for controlling a column address and column scanning, a vertical scanning circuit (row scanning circuit) 14 for controlling a row address and row scanning, a communication/timing controller 20 having a function of generating an internal clock, etc.

In this regard, as shown by a dotted line in the figure, a clock conversion section 23, which is an example of a high-speed clock generation section and generates pulses having a higher-speed clock frequency than the input clock frequency, may be disposed in the vicinity of the communication/timing controller 20. The communication/timing controller 20 generates an internal clock on the basis of the input clock (master clock) CLK0 input through a terminal 5a and a high-speed clock generated by the clock conversion section 23.

It becomes possible for the AD conversion processing, etc., to operate at a high speed using the signal derived from a high-speed clock generated by the clock conversion section 23. Also, it becomes possible to perform movement extraction and compression processing which need high-speed calculations. Also, it is possible to serialize the parallel data output from the column processing section 26, and to output video data D1 to the outside of the device. Thus, it is possible to employ the configuration to output high-speed operation using a smaller number of terminals than the number of bits of the AD converted digital data.

The clock conversion section 23 contains a multiplication circuit which generates a pulse signal having a higher-speed clock frequency than the input clock frequency. The clock conversion section 23 receives a low-speed clock signal CLK2 from the communication/timing controller 20, and generates a clock signal having a frequency two times or more the frequency based on that signal. For the multiplication circuit of the clock conversion section 23, a k1-multiplication circuit should be disposed assuming that k1 is a multiple of the frequency of the low-speed clock CLK2. Thus, various known circuits may be used.

In FIG. 1, a part of the rows and the columns are omitted for simplicity. However, in reality, from tens to thousands of unit pixels 3 are disposed to constitute the pixel area 10. The unit pixel 3 typically includes a photo diode as a light receiving element (electric-charge generation section) and an amplifier within a pixel, which includes a semiconductor element (for example transistor) for amplification.

For the amplifier within a pixel, for example a floating diffusion amplifier configuration is used. As an example, a general configuration including four transistors as a general CMOS sensor which includes a read selection transistor which is an example of a charge read section (transfer gate section/read gate section) for the charge generation section, a reset transistor which is an example of a rest gate section, a vertical transistor, and a source-follower amplification transistor which is an example of a detection element for detecting the voltage change of the floating diffusion.

Alternatively, as described in Japanese Examined Patent Application Publication No. 2708455, it is possible to use a configuration including three transistors, that is to say, an amplification transistor connected to a drain line (DRN) for amplifying a signal voltage corresponding to the signal charge generated by the charge generation section, a reset transistor for resetting the charge generation section, and a read selection transistor (transfer gate section) scanned by the vertical shift register through a transfer line (TRF).

The pixel area 10 includes a reference pixel area for giving optical black disposed in the surroundings of the effective image area in addition to an effective image area (effective area), which is an effective area for capturing an image. One example is the case where several rows (for example 1 to 10 rows of reference pixels giving optical black are disposed at the upper and lower parts in the vertical column direction. Also, a few to tens of pixels (for example 3 to 40 pixels) of reference pixels giving optical black are disposed at the right and left parts of the horizontal rows including an effective image area 10a.

The reference pixel giving optical black has a charge generation section including a photo diode which is shielded in order to prevent light entering at the light receiving surface. The image signal from this reference pixel is used for a black reference of a video signal.

Also, the solid-state imaging device 1 has a pixel area 10 enabled for color-imaging. That is to say, the light receiving surface, on which an electromagnetic wave (light in this example) enters, of each charge generation section (photo diode, etc.) in the pixel area 10 is provided with any one of color filters of a color resolution filter including a combination of a plurality of color filters for picking up a color image.

In the shown example, a basic color filter of a so-called a Bayer array is used. The pixel area 10 includes 2 pixels×2 pixels of repetition units of color separation filters such that the unit pixels 3 arranged in a tetragonal lattice corresponds to three color filters, red (R), green (G), and blue (B).

For example, a first color pixel for detecting a first color (red; R) is disposed in an odd-number row and an odd-number column, a second color (green; G) is disposed in an odd-number row and an even-number column and even-number row and an odd-number, and a third color (blue; B) is disposed in an even-number row and an even-number column. Thus, different two-color pixels, R/G or G/B are disposed for each row in a checkered state.

In such a color arrangement of basic color filters of a Bayer array, two colors, R/G or G/B, are repeated both in the row direction and in the column direction for each two elements.

Also, as the other constituents of the drive controller 7, a horizontal scanning circuit 12, a vertical scanning circuit 14, and a communication/timing controller 20 are provided. The horizontal scanning circuit 12 has a function of read-scanning section reading out the count value from the column processing section 26. Each constituent of the drive controller 7 is integrally formed in a semiconductor area, such as a mono-crystal silicon along with the pixel area 10 using the same technique as a semiconductor integrated circuit production technique, and thus a solid-state imaging device (imaging device), which is an example of a semiconductor system, is formed.

The unit pixel 3 is connected to the vertical scanning circuit 14 and the column processing section 26, in which a column AD circuit 25 is disposed for each vertical column, through a row control line 15 for selecting a row and a vertical signal line 19, respectively. Here, the row control line 15 denotes all the lines entering from the vertical scanning circuit 14 to the pixel.

The horizontal scanning circuit 12 and the vertical scanning circuit 14 include a decoder as described below, and start shift operation (scanning) in response to control signals CN1 and CN2 given from the communication/timing controller 20. Thus, the row control line 15 includes various pulse signals (for example, a reset pulse RST, a transfer pulse TRF, a DRN control pulse DRN, etc.) for driving the unit pixel 3.

Although not shown, the communication/timing controller 20 includes a function block of a timing generator TG (an example of) which supplies a clock and a predetermined timing pulse signals necessary for the operation of each section, and a function block of a communication interface which receives a master clock CLK0 through a terminal 5a, receives data DATA for commanding an operation mode, etc., through a terminal 5b, and further outputs data including information of the solid-state imaging device 1.

For example, the communication/timing controller 20 outputs a horizontal address signal to a horizontal decoder 12a, and outputs a vertical address signal to a vertical decoder 14a. Each of the horizontal decoder 12a and the vertical decoder 14a receives the signal and selects the corresponding row or column.

At this time, since the unit pixels 3 are disposed in a two-dimensional matrix, first, (vertical) scan reading is performed for accessing (concurrently for each column) and capturing the analog pixel signals generated by a pixel-signal generation section 5 and being output in the column direction through the vertical signal line 19 for each row. After that, (horizontal) scan reading is performed for accessing the pixel signals (in this example, digitized pixel data) in the row direction, the arrangement direction of the vertical columns) and reading out to the output side. Thus, the pixel signals and the pixel data should be read at a high speed. Of course, it is possible to perform random access for reading out only information of necessary unit pixels 3 by directly specifying the address of the unit pixel 3 to be read out without using scan reading.

Also, the communication/timing controller 20 supplies a clock CLK1 having the same frequency as the master clock CLK0 input through the terminal 5a, low-speed clocks produced by dividing that clock by two and produced by dividing that clock further to each section in the device, for example the horizontal scanning circuit 12, the vertical scanning circuit 14, and the column processing section 26. In the following, a clock signal having a frequency divided by two, and a clock signals having a frequency further divided are all put together to be called a low-speed clock CLK2.

The vertical scanning circuit 14 selects a row of the pixel area 10, and supplies a necessary pulse signal to the row. For example, the vertical scanning circuit 14 has the vertical decoder 14a for specifying (selecting a row of the pixel area 10) a reading row in a vertical direction, and a vertical drive circuit 14b for supplying a pulse signal to a control line 15 for the unit pixel 3 on the reading address (row direction) specified by the vertical decoder 14a for driving. In this regard, the vertical decoder 14a selects a row for an electronic shutter in addition to a row for reading out a signal.

The horizontal scanning circuit 12 selects a column AD circuit of the column processing section 26 in synchronism with the low-speed clock CLK2 in sequence, and leads the signal to the horizontal signal line (horizontal output line) 18. For example, the horizontal scanning circuit 12 has the horizontal decoder 12a for specifying (selecting an individual column AD circuit 25 in the column processing section 26) a reading column in a horizontal direction, and a horizontal drive circuit 12b for leading each signal of the column processing section 26 to a horizontal signal line 18 in accordance with the reading address specified by the horizontal decoder 12a. In this regard, the horizontal signal lines 18 are disposed, for example, for the number of bits n (n is a positive integer) to be handled by the column AD circuit 25, for example, given 10 (=n) bits, 10 lines are disposed corresponding to the number of bits.

In the solid-state imaging device 1 having such a configuration, the pixel signal output from the unit pixel 3 is supplied to the column AD circuit 25 of the column processing section 26 for each vertical column through the vertical signal line 19.

Each column AD circuit 25 of the column processing section 26 receives pixel signals for one column and processes the signals. For example, each column AD circuit 25 has an ADC (Analog-to-Digital Converter) circuit which converts an analog signal into, for example 10-bit digital data using, for example a low-speed clock CLK2.

The AD conversion processing in the column processing section 26 employs a method for performing AD conversion in parallel for each row on the analog signal held in parallel for each row using the column AD circuit 25 provided for each column. At this time, an AD conversion method of a single-slope integration type (or a ramp-signal comparison type) described in, for example Japanese Examined Patent Application Publication No. 2532374 or the scientific document "CMOS image sensor equipped with a column-type AD converter having no FPN between columns" (Eijyogakugiho, IPU2000-57, pp. 79-84), etc. This method makes it possible to achieve an AD converter with a simple configuration, and thus has a feature of keeping the circuit size small even when being disposed in parallel.

A detailed description will be given of the configuration of the ADC circuit later. Analog signal to be processed is converted into digital data on the basis of the time period from the start of the conversion to the time of the matching between the reference voltage RAMP and the signal voltage to be processed. The mechanism for this is as follows. In theory, a ramp-state reference voltage RAMP is supplied to a comparator (voltage comparator) and the counting by the clock signal is started at the same time. Until a pulse signal is obtained by comparing the analog pixel signal input the vertical signal line 19 with the reference voltage RAMP, the counting is continued, and thus the AD conversion is performed.

Also, at this time, it is possible to perform processing on the pixel signal of the voltage mode input through the vertical signal line 19 to calculate the difference between the signal level (noise level) immediately after resetting the pixel and the true (corresponding to the amount of received light) signal level Vsig. Thus, it is possible to eliminate noise signal components called fixed pattern noise (FPN) and reset noise.

The pixel data digitized by the column AD circuit 25 is transmitted to the horizontal signal line 18 through a horizontal selection switch, not shown, driven by the horizontal selection signal from the horizontal scanning circuit 12, and is further input to the output circuit 28. In this regard, 10 bits is an example, and any other number of bits, such as less than 10 bits (for example, 8 bits) or the number of bits exceeding 10 bits (for example, 14 bits) may be used.

With such a configuration, pixel signals of each vertical column are output in sequence for each row from the pixel section 10 in which light receiving elements as charge generation sections are arranged in a matrix. Thus, one piece of image corresponding to the pixel section 10 in which light receiving elements are arranged in a matrix, that is to say, a frame image is represented by a set of all the pixel signals of the pixel section 10.

Details of Column AD Circuit and Reference-Signal Generation Section

The reference-signal generation section 27 individually includes DA conversion circuits (DAC; Digital-to-Analog Converters), which are function elements for generating reference signals for AD conversion in accordance with the types of color and array of color filters constituting color resolution filters in the pixel area 10. The details will be described later. The reference-signal generation section 27 in this embodiment employs DA conversion circuits of a current-output type.

When the pixel area 10 (device) to be used is determined, the color type and array of a color filters in a color-resolution filter is determined, and thus the color of a color filter at any position of a two-dimensional lattice can be determined uniquely. Accordingly, one row to be processed by each column AD circuit 25 disposed in parallel with columns does not include all the colors to be used by the color-resolution filter, but includes pixel signals of only a predetermined combination of colors that are determined by a repetition cycle.

In the present invention, when configuring an AD conversion circuit using a comparison circuit and a counter, a DA conversion circuit, which is a functional element for generating a reference signal for AD conversion to be supplied to a comparison circuit and an example of the individual reference-signal generation output section corresponding to a color, is not provided for all the colors used for the color-resolution filter. First, regarding the row direction, which is a reading unit of a pixel signal, only the number of colors corresponding to the combination of color filters of predetermined colors in a repetition cycle of a color filter are disposed. Thus, it becomes possible to make the number of color filters less than the number of all the colors contained in the repetition cycle of the color filters in two dimensions. For example, for any row to be processed, when there are only x (x is a positive integer of two or more) colors in the row, the reference signal of the colors corresponding to that x colors should be supplied to the comparison circuit, and thus it is sufficient to provide x units of the DA conversion circuits.

In this regard, from the viewpoint of supplying individual reference signals having change characteristics corresponding to colors and initial values to the comparison circuit, it is necessary to handle the change of rows to be processed. In order to do this, x units of the DA conversion circuits should individually be provided with a change mechanism for supplying a reference signal for the processing color at that time in the column direction perpendicular to the row direction.

That is to say, for the direction different from the row direction in accordance with the read unit, namely the vertical column direction, the color corresponding reference-signal generation section which changes with the change characteristic (specifically, the slope) in accordance with the color characteristic of a color pixel and the initial value specified by the viewpoint of non-color characteristics different from the color characteristics, such as the black reference and the offset component of the circuits are disposed for the number of the combination of the color filters of predetermined colors existent in the repetition cycle of color filters in the vertical direction for each individual DA conversion circuit (reference-signal generation/output section). Then, a selection section which selects any one of individual reference signals generated in the reference-signal generation/output section, and supplies the signal to the comparison circuit is disposed.

In this case, for example if there are color filter of the same color in the repetition cycle of color filters in two dimensions as a Bayer array, it is possible to employ a configuration in which individual DA conversion circuits (reference-signal generation/output section) share one color corresponding reference-signal generation section for the color filter of the same color.

In any configuration, each of the DA conversion circuits, which is an example of reference-signal generation/output section, changes and outputs the change characteristic (specifically, the slope) of the reference signal (analog reference voltage) generated by the DA conversion circuit in accordance with the characteristic of the color filter, namely analog pixel signal when the row to be processed is changed and the combination of predetermined colors in that row changes. Also, for the initial value, the setting is carried out on the basis of the viewpoint different from the color characteristics, such as black reference, an offset component of the circuit, etc.

In this manner, it is possible to make the number of the reference-voltage generators (in this example, corresponds to the DA conversion circuit) and wiring lines from the reference-voltage generator less than the number of color filters constituting the color resolution filter. Also, it becomes unnecessary to dispose selection means (a multiplexer) for each vertical column, which has been necessary (refer to Japanese Unexamined Patent Application Publication No. 2000-152082) when the reference-voltage generators are provided for each color filter, and which selectively outputs an analog reference voltage (corresponds to the reference signal in this example) from each reference-voltage generator. Thus, it is possible to reduce the circuit size. It is possible to make the number of signal lines for transmitting the reference signals in accordance with the color pixels to the input side of the comparator less than the number of color components of the color filter for capturing a color image.

In this regard, although not employed in the present embodiment, the communication/timing controller 20 may set, for individual DA conversion circuits (reference-signal generation/output sections), the change characteristic (specifically, the slope) in accordance with the color characteristic of the corresponding color pixel when the row to be processed is changed and the combination of colors constituting the repetition unit of the color filter array accompanied the change is changed, and the initial values based on different viewpoint from the color characteristics, such as the black reference and the offset component of the circuit. In this manner, it becomes unnecessary to dispose a color corresponding reference-signal generation section for each individual DA conversion circuit (reference-signal generation/output section) and a selection section for selecting any one of the color corresponding reference-signal generation section.

That is to say, as a point of view, if the change characteristic (specifically, the slope) and the initial value is set in the DA conversion circuit for each change of the row to be processed in accordance with the change of the combination of colors constituting the repetition unit of the color filter array accompanied by that change, it is not necessary to dispose the color corresponding reference-signal generation section in accordance with each color filter and a selection section for changing the color corresponding reference-signal generation section in accordance with the row to be processed. Thus, it is possible to further reduce the size of the entire configuration of the reference-signal generation section 27. However, in this case, the processing of the control system of the reference-signal generation section 27 may become more complicated.

In this example, the solid-state imaging device 1 uses a Bayer method basic array, and the repetition of the color filter becomes for each two rows and two columns as described above. The pixel signals are read out for each row, and the pixel signals are input into each column AD circuit 25 disposed in parallel with columns for each vertical signal line 19. Thus, there are pixel signals of only two colors, namely either R/G or G/B in one row to be processed. Accordingly, in this example, the DA conversion circuit 27a corresponding to odd columns and the DA conversion circuit 27b corresponding to even columns are provided.

Furthermore, each of the reference signals RAMPa and RAMPb independently output from each of the DA conversion circuits is transmitted to the voltage comparison section 252 through each independent common reference-signal lines 251a and 251b (called 251 together). A plurality of the voltage comparison section 252a (of odd columns) and the voltage comparison section 252b (of even columns) are connected to each of the common reference-signal lines 251a and 251b, respectively.

At this time, the reference signals are configured to virtually directly transmitted to a plurality of voltage comparison sections 252a and 252b corresponding to color filters having common color characteristics through individually independent common reference-signal lines 251a and 251b. "Virtually directly transmitted through individually independent common reference-signal lines 251a and 251b" means that there is no selection means, such as a multiplexer, etc., between the common reference-signal lines 251a and 251b and the voltage comparison sections 252a and 252b (a plurality of them individually) of the corresponding columns. This configuration is very different from the configuration in Japanese Unexamined Patent Application Publication No. 2000-152082 in which reference signals output from each analog reference-voltage generator are transmitted to the input side of the comparator for each vertical column, and selection means (multiplexer) is disposed at immediately before the input side of individual comparators for selectively outputting any one of the reference signals from each analog reference-voltage generator.

Each of the DA conversion circuits 27a and 27b generates a stepwise saw-tooth wave (ramp waveform) in synchronism with the count clocks CKdaca and CKdacb (may be the same as the count clock CK0) received from the communication/timing controller 20 from the initial value indicated by the control data CN4 (CN4a and CN4b) received from the communication/timing controller 20. Each of the DA conversion circuits 27a and 27b supplies the generated saw-tooth wave to each of the corresponding column AD circuit 25 of the column processing section 26 as reference voltages (ADC reference signal) RAMPa and RAMPb for AD conversion. In this regard, although not shown in the figure, a noise prevention filter may be provided.

When the DA conversion circuits 27a and 27b perform AD conversion processing using the voltage comparison section 252 and the counter section 254 on the signal component Vsig of the pixel signal Vx at a predetermined position as a special function of the present embodiment, the DA conversion circuits 27a and 27b set the initial values of the reference voltages RAMPa and RAMPb generated individually to different values from the time of the AD conversion processing on the reset component ΔV by reflecting the pixel characteristics and the circuit variations, and set the individual slopes βa and βb to suit to the pixel characteristic in consideration of the color filter array.

Specifically, first, the initial values Vas and Vbs of the reference voltages RAMPa and RAMPb on the signal component Vsig are calculated on the basis of the signal obtained from the pixel for generating a plurality of any black references. In this regard, the reference pixel generating black reference is a pixel having a shielded field on a photo diode, etc., as a photoelectric transfer element constituting a charge generation section 32 disposed other than a color pixel. The arrangement form, such as an arrangement location, the number of arranged pixels, etc., and the shielding means are not particularly limited, and the publicly known mechanism can be employed.

Also, the initial voltages include particular variation components derived from the characteristics of individual DA conversion circuits 27a and 27b. Usually, each of the initial voltages Vas and Vbs is reduced by the offsets OFFa and OFFb from the initial voltages Var and Vbr of the reference voltages RAMPa and RAMPb on the reset component ΔV.

Even if the initial voltages Var and Vbr of the reference voltages RAMPa and RAMPb on the reset component ΔV are set to equal, the initial voltages Vas and Vbs of the reference voltages RAMPa and RAMPb on the signal component Vsig become different.

In this regard, the initial voltages Vas and Vbs of the reference voltages RAMPa and RAMPb on the signal component Vsig may include any offset other than a signal obtained from the pixel generating the black reference.

On the control of the offsets OFFa and OFFb performed by each of the DA conversion circuits 27a and 27b of the reference-signal generation section 27, the communication/timing controller 20 may have, for example a function of calculating the initial voltage on the basis of the signal obtained from the reference pixel generating a plurality of any black references, and the control may be performed on the basis of the initial value indicated by the control data CN4 from the communication/timing controller 20. Of course, the DA conversion circuits 27a and 27b may have a function of calculating the initial voltage, and may calculate the initial value by itself.

Alternatively, the communication/timing controller 20 and the DA conversion circuits 27a and 27b may not have a function of calculating the initial voltage of the reference voltage inside of the chip, and an external system outside the chip may calculate the initial voltage on the basis of the signal obtained from the reference pixel generating a black reference. The information indicating the initial voltage as a part of the operation mode may be notified to the communication/timing controller 20 through the terminal 5, and the information may be notified to the reference-signal generation section 27 by the control data CN4 from the communication/timing controller 20.

In this regard, it is possible for the stepwise reference signal generated by the reference-signal generation section 27, the reference signal RAMPa generated by the DA conversion circuit 27a and the reference signal RAMPb generated by DA conversion circuits 27b in detail, may be changed at higher speed than those generated on the basis of the master clock CLK0 input through the terminal 5a by generating on the basis of a high-speed clock from the clock conversion section 23, for example a multiplication clock generated by a multiplication circuit.

The control data CN4a and C4b supplied from the communication/timing controller 20 to the DA conversion circuit 27a of the reference-signal generation section 27 includes information indicating the slope (the degree of change; the amount of change in time) of the ramp voltage for each comparison processing.

The column AD circuit 25 includes a voltage comparison section (comparator) 252 which compares the reference signal RAMP generated by the DA conversion circuit 27a of the reference-signal generation section 27 and an analog pixel signal obtained from the unit pixel 3 through the vertical signal line 19 (H1, H2, ... ) for each row control line 15 (V1, V2, ...) and a counter section 254 which counts the time until the voltage comparison section 252 completed the comparison processing and holds the result, and has an n-bit AD conversion function.

The communication/timing controller 20 has a function of controller for changing the count processing mode of the counter section 254 in accordance with whether the voltage comparison section 252 is performing the comparison processing on the reset component ΔV or the signal component Vsig of the pixel signal. A control signal CN5 for instructing the counter section 254 to operate in a down-count mode or an up-count mode is input from the communication/timing controller 20 to the counter section 254 of each column AD circuit 25.

The stepwise reference signal RAMP is input into one of the input terminals RAMP of the voltage comparison section 252 in common with the input terminal RAMP of the other voltage comparison sections 252. The other of the input terminals is connected to the vertical signal line 19 of the individually corresponding vertical column, and individually receives the input of the pixel-signal voltage from the pixel area 10. The output signal of the voltage comparison section 252 is supplied to the counter section 254.

The counter clock CK0 from the communication/timing controller 20 is input into the clock terminal CK of the counter section 254 in common with the clock terminal CK of the other counter sections 254.

The counter section 254, the configuration of which is omitted in the figure, can be achieved by changing the wiring form of the data storage section including latches to a synchronous counter form, and performs internal counting by the input of one count clock CK0. It is possible to make the count clock CK0 higher speed than the master clock CLK0 input through the terminal 5a on the basis of the high-speed clock (for example, a multiplication clock) from the clock conversion section 23 in the same manner as the stepwise voltage waveform.

It is possible to achieve an n-bit counter section 254 by the combination of n latches. The circuit size of the counter section becomes half the circuit size of the data storage section including two systems of n latches. In addition, the counter section for each column becomes unnecessary, and thus the entire size becomes remarkably compact.

Here, the counter section 254, the details of which will be described later, has a configuration in which a common up-down counter (U/D CNT) is used regardless of the count mode, and the down-count operation and the up-count operation can be changed (specifically, alternately) for the count processing. Also, the counter section 254 uses a synchronous counter which outputs the count output value in synchronism with the count clock CK0.

In this regard, in the case of a synchronous counter, the operation of all the flip-flops (counter basic element) is limited by the count clock CK0. Thus, if a higher frequency operation is requested, the operation limit frequency of the counter section 254 is determined only by the limit frequency of the first flip-flop (counter basic element). Accordingly, it is preferable to use an asynchronous counter suitable for a high-speed operation.

The control pulses are input into the counter section 254 from the horizontal scanning circuit 12 through the control line 12c. The counter section 254 has a latch function for holding the count result, and thus holds the counter output value until an instruction by a control pulse is received through the control line 12c.

The column AD circuit 25 having such a configuration is disposed for each vertical signal line 19 (H1, H2, ... ), and constitutes the column processing section 26, which is an ADC block arranged in parallel with columns.

The output side of each column AD circuit 25 is connected to the horizontal signal line 18. As described before, the horizontal signal line 18 has an n-bit width signal lines, which is the bit width of the column AD circuit 25, and is connected to the output circuit 28 through the n sense-circuits corresponding to each output line not shown.

With such a configuration, the column AD circuit 25 performs the count operation in a pixel-signal read period corresponding to the horizontal blanking period, and outputs the count result at a predetermined timing. That is to say, first, the voltage comparison section 252 compares the ramp waveform voltage from the reference-signal generation section 27 and pixel-signal voltage input through the vertical signal line 19. When both of the voltages become equal, the comparator output of the voltage comparison section 252 is inverted (in this example, transits from an H level to a L level).

The counter section 254 has started the count operation in the down-count mode or the up-count mode in synchronism with the ramp waveform voltage generated from the reference-signal generation section 27. When the information of the inversion of the comparator output is notified to the counter section 254, the counter section 254 stops the count operation, and latches (holds/stores) the count value at that time as the pixel data, and thus the AD conversion is completed.

After that, the counter section 254 outputs the stored/held pixel data to the outside of the column processing section 26 and the outside the chip having the pixel area 10 from the output terminal 5c on the basis of the shift operation by the horizontal selection signal CH (i) input from the horizontal scanning circuit 12 through the control line 12c at a predetermined timing.

In this regard, although not shown in particular because of having no relationship with the description of the present embodiment, the other various signal processing circuits, etc., are sometimes included in the components of the solid-state imaging device 1.

Description of Functions of Reference-Signal Generation Section

Figure 2:
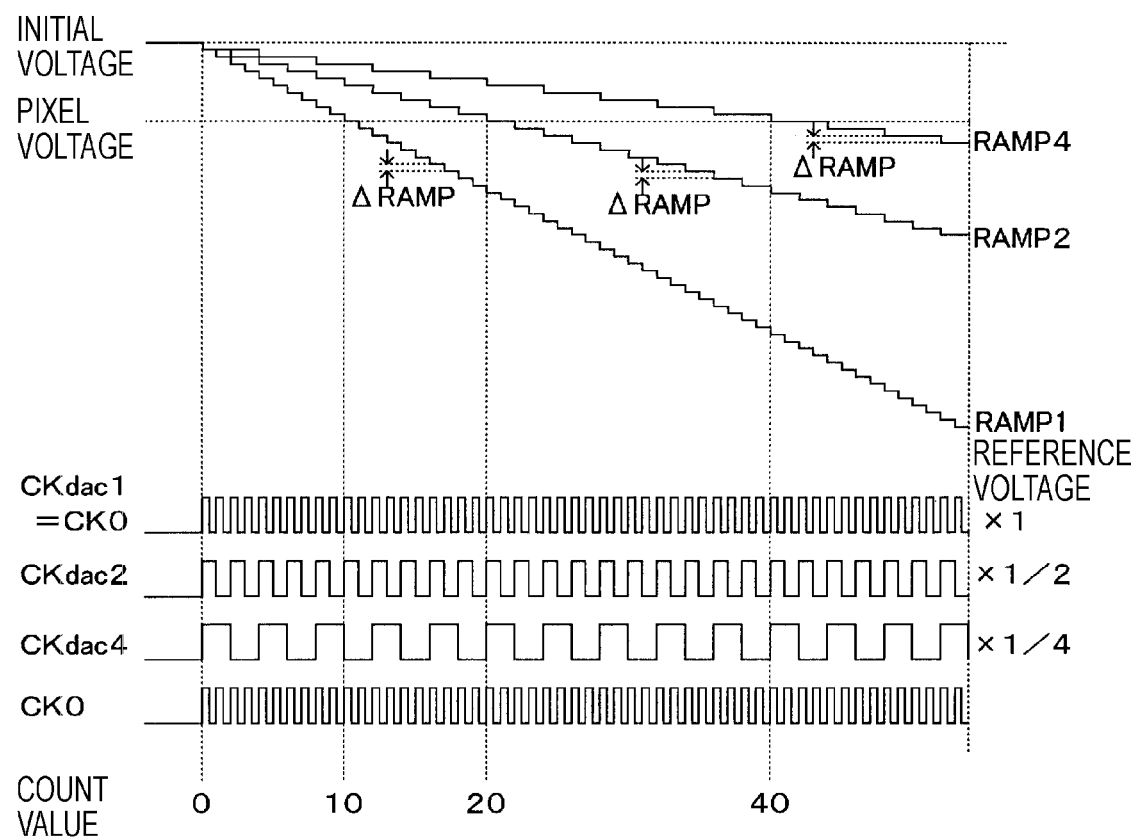
FIG. 2 is a diagram illustrating the function of a DA conversion circuit (DAC) of a reference-signal generation section used in the solid-state imaging device.

FIG. 2 is a diagram illustrating the function of a DA conversion circuit (DAC) of a reference-signal generation section 27 used in the solid-state imaging device 1.

The DA conversion circuits 27a and 27b receive the supply of the count clock CKdac for DAC from the communication/timing controller 20, and generates, for example a stepwise saw-tooth wave (ramp waveform) decreasing linearly in synchronism with the count clocks CKdaca and CKdacb. The DA conversion circuits 27a and 27b supplies the generated saw-tooth wave to the voltage comparison section 252 of the column AD circuit 25 as a reference voltage (ADC reference signal) for AD conversion.

Here, first, the DA conversion circuits 27a and 27b set an initial voltage on the basis of the information indicating the initial value of the ramp voltage for each comparison processing included in the control data CN4. At the same time, the DA conversion circuits 27a and 27b set a voltage variation ΔRAMP for one clock on the basis of the information indicating the slope (change rate) of the ramp voltage for each comparison processing included in the control data CN4, and changes the count value by 1 for each unit time (count clock CKdac). In reality, only the maximum voltage width may be set for the maximum number of count (for example, 1024 for 10 bits, etc.) of the count clock CKdac. Any circuit configuration may be used for setting an initial voltage.

In this manner, the DA conversion circuits 27a and 27b decrease voltage by ΔRAMP from the voltage (for example, 3.0 V) indicating the initial value included in the control data CN4 for each one of the count clocks CKdaca and CKdacb.

Also, when setting a coefficient for the pixel signal (true signal component for details) from the unit pixel 3, the communication/timing controller 20 supplies the count clock CKdacm having a frequency 1/m the reference frequency of the count clock CKdac1, which sets a coefficient 1, to the DA conversion circuit 27a. The DA conversion circuit 27a decreases voltage by ΔRAMP from the voltage (for example, 3.0 V) indicating the initial value included in the control data CN4 for each one count of the clock CKdacm.

In this manner, the slopes of the reference signals RAMPa and RAMPb supplied to the voltage comparison section 252 become 1/m the slopes of the reference signals RAMPa and RAMPb generated by the count clock CKdac1 (=CK0), and thus the count value becomes m times for the same pixel voltage in the counter section 254. That is to say, the coefficient can be set to m.

In other words, it is possible to change the slopes of the reference signals RAMPa and RAMPb by adjusting the cycles to the count clocks CKdaca and CKdacb. For example, if a clock having a frequency 1/m the frequency of the reference is used, the slope becomes 1/m. If the same count clock CK0 in the counter section 254 is used, the count value becomes m times for the dame pixel voltage. That is to say, the coefficient can be set to m. In other words, it is possible to adjust the coefficient of the differential processing described below by changing the slopes of the reference signals RAMPa and RAMPb.

As is understood from FIG. 2, the larger the slopes of the reference signals RAMPa and RAMPb, the smaller the coefficient of the amount of information stored in the unit pixel 3 becomes, and the smaller the slopes, the larger the coefficient becomes. For example, the coefficient can be set to "2" by giving the count clock CKdac2 ½ the reference frequency of the count clock CKdac1. Also, the coefficient can be set to "4" by giving the count clock CKdac4 ¼ the reference frequency. In this regard, it is possible to set the coefficient to m/n by giving the count clock CKdacnm m/n the reference frequency.

It becomes possible to control analog gain at the time of AD conversion by adjusting the slope. That is to say, it is possible to adjust the slope of the reference voltage by adjusting the coefficient. It is possible to adjust the amplitude of the reference signal for each unit time by changing the slope of the reference voltage, and this allows to function as the gain adjustment on the pixel signal to be compared. It becomes possible to perform AD conversion processing with γ correction on the analog signal by dynamically changing the slope during the DA conversion.

In this manner, it is possible to set the coefficient with ease and high precision by changing (decreasing in this example) voltage by ΔRAMP for each count clock CKdacm and adjusting the cycle of the count clock CKdacnm given to the reference-signal generation section 27. In this regard, it is possible to specify the sign (+/−) of the coefficient by adjusting the mode of the count processing on the signal component Vsig of the pixel signal.

In this regard, the method of the setting the coefficient using the slopes of the reference signals RAMPa and RAMPb shown here is an example, and the present invention is not limited to this method. Any circuit may be used. For example, there is a method of outputting the control voltage for setting the gain, which is calculated by y=α (initial value)−β*x assuming that the counter output value is x, and the slope (change rate) included in the control data CN4 is β while the cycle of the count clocks CKdaca and CKdacb to be given to the reference-signal generation section 27. Also, there is a method of adjusting the voltage change amount ΔRAMP for each one count clock CKdac by the information (namely, a gain control signal) indicating the slope (change rate) of the ramp voltage included in the control data CN4.

For example, it is possible to adjust the slope of the ramp voltage, namely the RAMP slope β by changing the amount of current of the unit current source to adjust ΔRAMP per one clock other than changing the number of clocks.

The method of setting α (initial value) for giving an offset and β (coefficient) for giving the slope should be determined in accordance with the configuration of the circuit for generating a ramp waveform of which voltage changes set by step for each of the count clocks CKdaca and CKdacb. As an example, when a circuit for generating a ramp waveform is configured by the combination of constant current sources and a selection circuit for selecting any one of or any number of the constant current sources, it is possible to achieve both α (initial value) for giving an offset and β (coefficient) for giving the slope using the constant current sources by adjusting the current running the constant current sources. A detailed description will be given on this point later.

Regardless of the method of generating the reference signal, it is possible to perform AD conversion processing using the reference signal preferable both in view of a color characteristic and in view of a characteristic other than color characteristic by providing the reference signal with the slope in accordance with the color characteristic of a color pixel and initial value based on the viewpoint other than color characteristic, for example black reference, an offset component of the circuit.

Operation of Solid-State Imaging Device

FIG. 3 is a timing chart for illustrating signal capturing differential processing which is a basic operation in a column AD circuit 25 of the solid-state imaging device 1 shown in FIG. 1.

The method employed for converting an analog pixel signal detected by each unit pixel 3 of the pixel area 10 into a digital signal is as follows. For example, search is performed on a point where a reference signal RAMP decreasing with a predetermined slope in a ramp waveform and each voltage of a reference component and a signal component of the pixel signal from the unit pixel 3. A count value corresponding to each value of the reference component and the signal component is obtained by a count clock counting the time period until from the generation of the reference signal RAMP to be used for comparison to a point in time when the electronic signal corresponding to the reference component and the signal component equals the reference signal.

Here, the pixel signal output from the vertical signal line 19 includes, as a time-series signal, a signal component Vsig after a reset component ΔV including noise of the pixel signal. When first processing is performed on the reference numeral component (reset component ΔV), the second processing becomes the processing on the sum of the signals of the reference numeral component (reset component ΔV) and the signal component Vsig. In the following, a specific description will be given.

In order to read first time, first, the communication/timing controller 20 sets the mode control signal CN5 to a low level to set the counter section 254 in the down count mode, and sets the reset control signal CN6 to active (in this example, a high level) to reset the counter value of the counter section 254 to the initial value, "0" (t9). After the first reading from the unit pixel 3 of any row Vα to the vertical signal line 19 (H1, H2, . . . ) has become stable, the communication/timing controller 20 supplies the control data CN4a and CN4b for the generation of the reference signals RAMPa and RAMPb to the reference-signal generation section 27.

Upon receiving this, in the reference-signal generation section 27, first, the DA conversion circuit 27a generates the reference signal RAMPa having the slope βa suited to the color pixel characteristic of one of the colors (R or G in odd columns) in the Vα row and a stepwise waveform (RAMP waveform) changing in time in a saw-tooth state (RAMP state) on the whole, and supplies the signal to one of the input terminals of the voltage comparison section 252 of the column AD circuits 25 corresponding to odd columns as a comparison voltage.

In a similar manner, the DA conversion circuit 27b generates the reference signal RAMPb having the slope βb suited to the color pixel characteristic of the other of the colors (G or B in even columns) in the Vα row and a stepwise waveform (RAMP waveform) changing in time in a saw-tooth state (RAMP state) on the whole, and supplies the signal to one of the input terminals of the voltage comparison section 252 of the column AD circuit 25 corresponding to even columns as a comparison voltage.

The voltage comparison section 252 compares the RAMP-waveform comparison voltage and the pixel-signal voltage of any vertical signal line 19 (Hα) supplied from the pixel area 10.

Also, in order to measure the comparison time in the voltage comparison section 252 by the counter section 254 disposed for each row at the same time with the input of the reference signals RAMPa and RAMPb into the input terminal RAMP of the voltage comparison section 252, the counter clock CK0 is input from the communication/timing controller 20 to the clock terminal of the counter section 254 in synchronism with the ramp waveform voltage generated from the reference-signal generation section 27 (t10). The down count is started from the initial value "0" as the first count operation. That is to say, the count processing is started in the negative direction.

The voltage comparison section 252 compares the ramp-state reference signal RAMP from the reference-signal generation section 27 and the pixel-signal voltage Vx input through the vertical signal line 19. When both voltages become the same, the voltage comparison section 252 inverts the output of the comparator from an H level to a L level (t12). That is to say, the voltage signal in accordance with the reset component Vrst and the reference signal RAMP are compared, and after the elapse of time corresponding to the value of the reset component Vrst, the voltage comparison section 252 generates a pulse signal of active low (L), and supplies it to the counter section 254.

Upon receiving this result, the counter section 254 stops the count operation substantially at the same time with the inversion of the output of the comparator, and latches (holds and stores) the counter value at that time as the pixel data to complete the AD conversion (t12). That is to say, the down count is started with the generation of the ramp-state reference signal RAMP and counts the clock CK0 until an active-low (L) pulse signal is obtained the comparison processing in order to obtain the counter value corresponding to the value of the reset component Vrst.

After the elapse of a predetermined down count period (t14), the communication/timing controller 20 stops the supply of the control data to the voltage comparison section 252 and the supply of the counter clock CK0 to the counter section 254. Thus, the voltage comparison section 252 stops the generation of the ramp-state reference signal RAMP.

At the time of this first reading, the voltage comparison section 252 detects the reset level Vrst of the pixel-signal voltage Vx, and performs the count operation, and thus the reset component ΔV of the unit pixel 3 is read out.

This reset component ΔV includes noise that varies for each unit pixel 3 as an offset. However, the variations of the reset component ΔV is generally small. Also, the reset level Vrst is generally common to all the pixels, and thus the output value of the reset component ΔV of the pixel-signal voltage Vx of any vertical signal line 19 is substantially known.

Accordingly, at the time of reading the first reset component ΔV, it is possible to shorten the down count period (from t10 to t14; comparison period) by adjusting the RAMP voltage. In the present embodiment, the longest period of the comparison processing on the reset component ΔV is set to a 7-bit count period (128 clocks), and the comparison on the reset component ΔV is performed.

At the time of the subsequent second reading, the reading is performed on the electronic signal component Vsig in accordance with the amount of incident light for each unit pixel 3 in addition to the reset component ΔV, and the same operation as the first reading is performed. That is to say, first, the communication/timing controller 20 sets the mode control signal CN5 to a high level to set the counter section 254 in the up-count mode (t18). After the second reading from the unit pixel 3 of any row Vα to the vertical signal line 19 (H1, H2, . . . ) has become stable, in order to perform the AD conversion processing on the signal component Vsig, the communication/timing controller 20 supplies the control data CN4a for the generation of the reference signal RAMPa (here, including an offset OFFa and the slope βa) to the DA conversion circuit 27a, and supplies the control data CN4b for the generation of the reference signal RAMPb (here, including an offset OFFb and the slope βb) to the DA conversion circuit 27b.

Upon receiving this, in the reference-signal generation section 27, first, the DA conversion circuit 27a generates the reference signal RAMPa having the slope βa suited to the color pixel characteristic of one of the colors (R or G in odd columns) in the Vα row and a stepwise waveform (RAMP waveform) changing in time in a saw-tooth state (RAMP state) on the whole and having fallen the offset OFFa from the initial value Var for the reset component ΔV, and supplies the signal to one of the input terminals of the voltage comparison section 252 of the column AD circuits 25 corresponding to odd columns as a comparison voltage.

In a similar manner, the DA conversion circuit 27b generates the reference signal RAMPb having the slope βb suited to the color pixel characteristic of the other of the colors (G or B in even columns) in the Vα row and a stepwise waveform (RAMP waveform) changing in time in a saw-tooth state (RAMP state) on the whole and having fallen the offset OFFb from the initial value Vbr for the reset component ΔV, and supplies the signal to one of the input terminals of the voltage comparison section 252 of the column AD circuit 25 corresponding to even columns as a comparison voltage.

The voltage comparison section 252 compares the RAMP-waveform comparison voltage and the pixel-signal voltage of any vertical signal line 19 (Vx) supplied from the pixel area 10.

As described before, the initial value of each reference voltage at this time is calculated on the basis of the signal obtained from the pixel for generating a plurality of any black references, and has different values (the offset OFFa and the offset OFFb) including specific variation components of individually caused by the reference signal RAMPa generated by the DA conversion circuit 27a and the reference signal RAMPb generated by the DA conversion circuit 27b. Also, the initial voltage of the reference voltage sometimes includes any offset other than the signal obtained from the pixel generating the black reference.

In order to measure the comparison time in the voltage comparison section 252 by the counter section 254 disposed for each row at the same time with the input of the reference signals RAMPa and RAMPb into the input terminal RAMP of the voltage comparison section 252, the counter clock CK0 is input from the communication/timing controller 20 to the clock terminal of the counter section 254 in synchronism with the ramp waveform voltage generated from the reference-signal generation section 27 (t20). The up count is started, on the contrary to the first time, from the count value corresponding to the reset component ΔV of the unit pixel 3 obtained at the time of the first reading as the second count operation. That is to say, the count processing is started in the positive direction.

The voltage comparison section 252 compares the ramp-state reference signal RAMP from the reference-signal generation section 27 and the pixel-signal voltage Vx input through the vertical signal line 19. When both voltages become the same, the voltage comparison section 252 inverts the output of the comparator from an H level to a L level (t22). That is to say, the voltage signal in accordance with the signal component Vsig and the reference signal RAMP are compared, and after the elapse of time corresponding to the value of the signal component Vsig, the voltage comparison section 252 generates a pulse signal of active low (L), and supplies it to the counter section 254.

Upon receiving this result, the counter section 254 stops the count operation substantially at the same time with the inversion of the output of the comparator, and latches (holds and stores) the counter value at that time as the pixel data to complete the AD conversion (t22). That is to say, the counter section 254 starts the down count with the generation of the ramp-state reference signal RAMP to be supplied to the voltage comparison section 252 and counts the clock CK0 until an active-low (L) pulse signal is obtained by the comparison processing in order to obtain the count value corresponding to the value of the signal component Vsig.

After the elapse of a predetermined down count period (t24), the communication/timing controller 20 stops the supply of the control data to the voltage comparison section 252 and the supply of the counter clock CK0 to the counter section 254. Thus, the voltage comparison section 252 stops the generation of the ramp-state reference signal RAMP.

At the time of this second reading, the voltage comparison section 252 detects the signal component Vsig of the pixel-signal voltage Vx, and performs the count operation, and thus the signal component Vsig of the unit pixel 3 is read out.

Here, in the present embodiment, the count operation in the counter section 254 is performed by down counting at the time of the first reading, and by up counting at the time of the second reading. Thus, the subtraction shown by the expression (1) is automatically carried out in the counter section 254, and the counter value of the subtraction result is held in the counter section 254.

[Expression 1]

(the count value during the second comparison period)−(the count value during the first comparison period)   (1)

Here, the expression (1) can be transformed to the expression (2), and thus the counter value held in the counter section 254 becomes the value corresponding to the signal component Vsig as a result.

[Expression 2]

(the second comparison period)−(the first comparison period)=(the signal component $V$sig+the reset component Δ$V$+the offset component of the column AD circuit 25−(black reference component))−(the reset component Δ$V$+the offset component of the column AD circuit 25)=(the signal component $V$sig)−(the black reference component)   (2)

That is to say, as described above it is possible to eliminate the reset component ΔV including the variations for each unit pixel 3 and the offset component for each column AD circuit 25 by the subtraction processing in the counter section 254 including two times of reading and count processing, namely the down count at first reading time and the count up at second reading time. Thus, it is possible to extract only the digital data of the sum signal of the signal component Vsig in accordance with the amount of incident light for each unit pixel 3 and the correction of the black reference component with a simple configuration. There is an advantage in that variations of circuits and the reset noise can also be eliminated at this time.

Accordingly, the column AD circuit 25 of the present embodiment operates not only as a digital conversion section for converting analog pixel signals into digital pixel data, but also operates as a CDS (Correlated Double Sampling) processing function section.

Also, the pixel data indicated by the counter value obtained by the expression (2) shows a positive signal voltage, and thus complementary operations become unnecessary, and has a high affinity with existing systems.

Here, at the time of the second reading, the signal component Vsig in accordance with the amount of incident light is read out. Thus, it is necessary to have a wide up-count period (t20 to t24; comparison period) and to change the ramp voltage to be supplied to the voltage comparison section 252 greatly in order to determine the amount of light in a wide range.

Thus, in the present embodiment, the longest period of the comparison processing on the signal component Vsig is set to 10-bit count period (1024 clocks), and the comparison is made on the signal component Vsig. That is to say, the longest period of the comparison processing on the reset component ΔV (reference component) is made shorter than the longest period of the comparison processing on the signal component Vsig. Both of the longest period of the comparison processing, namely the maximum value of the AD conversion period, on the reset component ΔV (reference component) and the signal component Vsig are not made equal. The longest period of the comparison processing on the reset component ΔV (reference component) is made shorter than the longest period of the comparison processing on the signal component Vsig, and thus the total AD conversion period of the two times is devised to become short.

In this case, although the number of comparison bits is different between the first time and the second time, the communication/timing controller 20 supplies control data to the reference-signal generation section 27, and the reference-signal generation section 27 generates the ramp voltage on the basis of this control data. Accordingly, the slope of the ramp signal, namely the change rate of the reference signal RAMP is made the same between the first time and the second time. The ramp voltage is generated by digital control, and thus it is easy to make the slope of the ramp voltage the same between the first time and the second time. In this manner, the precision of the AD conversion is made equal, and thus the correct result of the subtraction shown by the expression (1) using the up-down counter can be obtained.

At a predetermined timing (t28) after the completion of the second count processing, the communication/timing controller 20 instructs the horizontal scanning circuit 12 to read out the pixel data. Upon receiving this, the horizontal scanning circuit 12 shifts in sequence the horizontal selection signals CH (i) to be supplied to the counter section 254 through the control line 12c.

In this manner, the count value, indicated by the expression (2), held and stored in the counter section 254, that is to say, the pixel data represented by the n-bit digital data is output in sequence out of the column processing section 26 and outside the chip having the pixel area 10 from the output terminal 5c through n horizontal signal line 18. After that, the same operation is repeated for each row in sequence, and thus the video data D1 representing a two-dimensional image is obtained.

As described above, in the solid-state imaging device, up-down counters are used, and the count processing is performed two times by changing the processing modes of the counter. Also, the imaging device has a configuration of column-parallel column AD circuit including column AD circuit 25 for each vertical column in the arrangement of the unit pixels 3 in a matrix.

Here, when configuring an AD conversion circuit using a comparison circuit and a counter, a DA conversion circuit, which is a functional element for generating a reference signal for AD conversion to be supplied to a comparison circuit, is not provided for all the colors in the color-resolution filter. The DA conversion circuits are disposed for only the number of colors corresponding to the combination of color filters of predetermined colors in a repetition cycle determined by the types of colors and the array. Also, the change characteristic (specifically, the slope) and the initial value of the reference signal (analog reference signal) generated by the DA conversion circuit are changed in accordance with the change of the combination of predetermined colors in the row to be processed with the change of the row to be processed is changed in accordance with the characteristic of the color filter, namely the characteristic of the analog pixel signal.

Thus, the wiring lines from the DA conversion circuit functioning as a reference-voltage generator and the reference-voltage generator can be made fewer than the color filters constituting a color resolution filter. Also, it becomes unnecessary to provide a multiplexer for selectively outputting analog reference voltage (reference signal) which is necessary when a reference-voltage generator is provided for each color filter, and thus the circuit size can be reduced remarkably.

Also, the change characteristic (specifically, the slope) of the reference signal (analog reference signal) generated by the DA conversion circuit are changed in accordance with the change of the combination of predetermined colors in the row to be processed with the change of the row to be processed, reference voltages different from each other in accordance with the characteristic of each color pixels constituting the pixel area 10 are individually generated, and the comparison processing is performed. Accordingly, it is possible to finely control the characteristic of each color by adjusting the slope of the reference signal in accordance with the individual colors when analog pixel signal output from the unit pixel is converted into digital data.

In addition, the initial value of the reference signal generated by DA conversion circuit is changed to be set in accordance with the individual variation components and the black reference components generated by the DA conversion circuit, and thus it is possible to correct the variation of the circuits and to perform AD conversion only on the signal including the correction of the black reference component with a simple configuration.

Furthermore, it is possible to directly obtain the result of the subtraction processing of the reference component (reset component) from the signal component as the second count result for each vertical column. The memory device for holding individual count results of the reference component and the signal component can be achieved by the latch function, and thus it is not necessary to provide a special memory device for holding the AD converted data additionally.

In addition, a special subtracter for calculating the difference between the reference component and the signal component becomes unnecessary. Thus, it becomes possible to reduce the circuit size and the circuit area compared with a known configuration. In addition, it is possible to eliminate an increase of noise, and an increase in current and power consumption.

Also, the comparison section and the counter section constitute the column AD circuit (AD conversion section), it is possible to control the count processing using one line of count clock operating the counter and a control line for changing the count mode. Thus, it becomes unnecessary to provide a signal line leading the count value of the counter section to the memory device, which has been necessary in a known configuration. Accordingly, it is possible to eliminate an increase of noise, and an increase in current and power consumption.

That is to say, in the solid-state imaging device 1 in which an AD conversion device is mounted on the same chip, the voltage comparison section 252 and counter section 254 are paired to constitute the column AD circuit 25 as an AD conversion section, and the difference between the basic component (in the present embodiment, the reset component) and the signal component of the signal to be processed is output ad digital data. Thus, it is possible to resolve the problems, such as a circuit size, a circuit area, power consumption, the number of interface wiring lines with the other functional sections, the noise and the power consumption of this wiring, etc.

In this regard, although not shown in the figure, data storage section may be provided as an n-bit memory device holding the count result held by the counter section 254. A control pulse is input into the data storage section from the horizontal scanning circuit 12 through the control line 12c. The data storage section holds the count value fetched from counter section 254 until the receiving to the instruction by the control pulse through the control line 12c. The horizontal scanning circuit 12 has a function of the read scanning section for reading the counter value held by each data storage section in parallel with the each voltage comparison section 252 and the counter section 254 of the column processing section 26 performing the individual processing. With this configuration, it is possible to achieve pipeline processing.

That is to say, before the operation of the counter section 254 (t6), the count result of the previous row Hx−1 is transferred to the data storage section on the basis of the memory-transfer instruction pulse CN8 from the communication/timing controller 20.

By the operation shown in FIG. 3, after the completion of the second reading processing of the pixel signal to be processed, that is to say, the AD conversion processing, it is not possible to output the pixel data to the outside of the column processing section 26, and thus there is a restriction on the reading processing. In contrast, if the data storage section is provided at the subsequent stage of the counter section 254, it is possible to transfer the count value indicating the result of the previous subtraction processing to the data storage section prior to the first reading processing (AD conversion processing) of the pixel signal to be processed, and thus there is a restriction on the reading processing.

Accordingly, it is possible to independently control the count operation of the counter section 254, namely the AD conversion processing and the reading operation of the count result to the horizontal signal line 18. Thus, it is possible to achieve pipeline processing for performing the AD conversion processing and the reading operation of the signal to the outside (firstly to the horizontal signal line 18).

Basic Configuration of the Reference-Signal Generation Section

FIG. 4 is a diagram illustrating an example of a basic configuration of the reference-signal generation section 27. The reference-signal generation section 27 of the present embodiment is characteristically provided with a mechanism for adjusting ΔRAMP per one clock by changing the amount of the unit current source by digital control in addition to employing a current-output type DA conversion circuit as a basic configuration and changing the number of count clocks to be used in the DA conversion processing as a mechanism for adjusting the reference signal (ramp voltage), namely the slope β of the RAMP to be supplied to the voltage comparison section 252 of the column AD circuit 25. In this regard, the current-output type DA conversion circuit is a current-source cell matrix including a cell array arranged in a matrix.

Up to now, for the current-output type DA conversion circuit, a circuit for obtaining analog current output in accordance with digital input signal value has been provided using a plurality of current-source cells weighted by a predetermined current value in order to generate the same constant current, by selecting a current-source cell in accordance with the digital value of the multiple-bit digital input signal from the current-source cell, and additionally outputting the constant current output of the selected current-source cell.

For a circuit method of selecting a current-source cell, a large number of methods have been adopted, for example a decoding method, a binary method, a combination method of the two. Among them, a widely known method is convert a digital input signal to analog signal by dividing into two steps, an upper bits and a lower bits (for example, refer to Japanese Unexamined Patent Application Publication No. 11-17545).

However, in a known combination method, the upper bits of an input digital signal are decoded into a decimal method, and the lower bits are divided into a binary method. Furthermore, in the decoding method, the selection of the constant current-source cell arranged in a matrix is performed by decoding and latching. Thus, when the input digital signal becomes high speed, it becomes difficult to simultaneously operate an apparatus divided into a decoding method and a binary method, and to reliably decode and latch at a high speed to select a sell. As a result, it causes a glitch occurrence and miscoding occurrence, and thus it becomes difficult to achieve a stable operation.

Also, for example when a reference signal corresponding to color in accordance with the array of the color separation filters, it is necessary to supply a reference signal changing at a change rate (for example decreasing rate) in accordance with color to a comparator. At this time, high precision is necessary for the setting of the change rates in order to separately adjusting to color.

Also, in order to ensure a dynamic range, at the time of imaging in a dark place short of input light, it is necessary to adjust the gain (analog gain) of an imaging signal and to obtain digital data. At this time, high precision is necessary for setting the change rate in order to adjust to the input light.

In order to adjust the change rate of the reference signal, for example the reference signal generated with a reference change rate is considered to be gain adjusted using analog amplifier. However, it is difficult to adjust an analog gain in terms of precision. For example, it is difficult to fine adjust with the precision of 12 bits or more, and to reduce variations of the reference voltage.

Accordingly, in the present embodiment, a mechanism for eliminating such a problem is employed. A specific description will be given in the following.

Figure 4A:
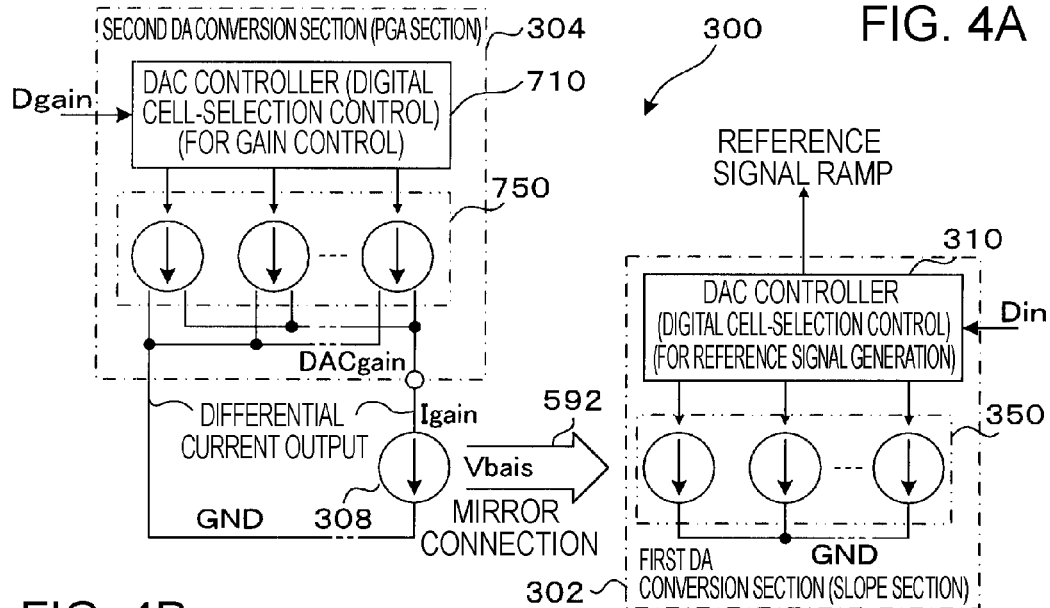
FIG. 4 is a diagram illustrating an example of a basic configuration of the reference-signal generation section.

As shown in FIG. 4A, the DA conversion section 300 of the present embodiment, which forms the reference-signal generation section 27 (DA conversion circuits 27a and 27b) includes a first DA conversion section 302, which functionally operates to generate the reference signal RAMP having predetermined slope and initial value, and a second DA conversion 304, which functionally operates to control (gain control) the slope of the reference signal generated by the first DA conversion section 302. In this regard, the first DA conversion section 302 functionally operates as a slope section (slope-type DA conversion section) for generating a slope-state reference voltage. The second DA conversion 304 functionally operates as programmable gain amplifier (PGA; Programmable Gain Amp) for controlling the first DA conversion section 302.

The first DA conversion section 302 and the second DA conversion section 304 include current-source cell sections 350 and 750, which are provided with a plurality of current-source cells individually generating a predetermined weighting output current values, and DAC controllers 310 and 710, respectively. The first DA conversion section 302 and the second DA conversion section 304 have current-output type DA conversion circuit for controlling the selection operation of the current-source cells by digital processing and performing DA conversion by the addition processing of the current output from the selected current-source cell.

Here, the output side of the second DA conversion section 304 is provided with current-source cell (also called a gain adjustment current-source cell below) 308. In the second DA conversion section 304, each current-source cell is selectively controlled by the digital processing, and current addition is performed at the DAC output terminal DACgain on the basis of one of the differential current output, and the additional current Igain is supplied to the gain adjustment current-source cell 308. The gain adjustment current-source cell 308 supplies a control voltage (gain control output signal) Vbais based on the additional current Igain to each current-source cell of the first DA conversion section 302 through the current control line 592. It is possible to control the slope of the reference signal RAMP by controlling the control voltage Vbais. That is to say, the slope of the reference signal RAMP to be used in the single-slope integration type AD conversion method, which is generated by the first DA conversion section 302 is adjusted by the digital control of the second DA conversion section 304.

Here, The first DA conversion section 302 and the second DA conversion section 304 are connected in a current mirror through the gain adjustment current-source cell 308. That is to say, the gain adjustment current-source cell 308 constitutes a current mirror with each of the current-source cells in the current-source cell section 350.

Figure 4B:
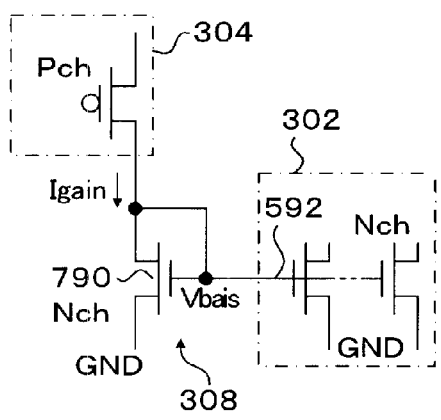

The gain adjustment current-source cell 308 includes, for example, as shown in FIG. 4B, an NMOS transistor 790 having a drain, to which the additional current Igain is supplied, the gate connected to the drain, and the source connected to the analog ground line. A bias voltage Vbais occurs across the gate (also drain) of the NMOS transistor 790. This bias voltage Vbais is supplied to the current control line 592 commonly connected to the gate of the NMOS transistor constituting each current-source cell disposed at the first DA conversion section 302.

Figure 4C:
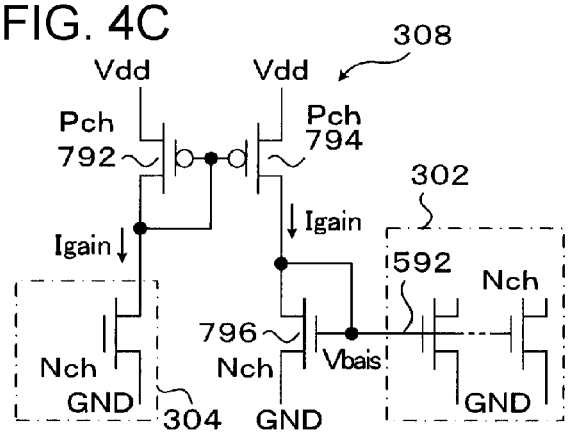

In this regard, in FIG. 4B, the NMOS transistor 790 is used for the gain adjustment current-source cell 308. this is the case where a PMOS transistor is used for each current-source cell constituting the second DA conversion section 304. As shown in FIG. 4C, when an NMOS transistor is used for each current-source cell constituting the second DA conversion section 304, first, the additional current Igain is received by a PMOS transistor 792.

Also, if the transistor constituting the gain adjustment current-source cell 308 and the transistor constituting each current-source cell disposed at the first DA conversion section 302 have different polarity (channel), a current/voltage conversion section is provided so as to constitute a current mirror with the transistor constituting each current-source cell disposed at the first DA conversion section 302.

For example, in FIG. 4C, a PMOS transistor 794 connected to the transistor 792 in a current mirror and an NMOS transistor 796 receiving the current output from the transistor 794 are provided, and the transistor 796 is connected similarly as the transistor 790.

That is to say, in the transistor 796, an additional current is supplied to the drain, the drain and the gate are connected, and the source is connected to analog ground. The gate (also drain) of the transistor 796 and the gate of the NMOS transistor constituting each current-source cell disposed at the first DA conversion section 302 are commonly connected. A bias voltage Vbais in accordance with the additional current occurs at the gate (also drain) of the NMOS transistor 796. This bias voltage Vbais is supplied to the current control line 592 commonly connected to the gate of the NMOS transistor constituting each current-source cell disposed at the first DA conversion section 302.

Figure 4D:
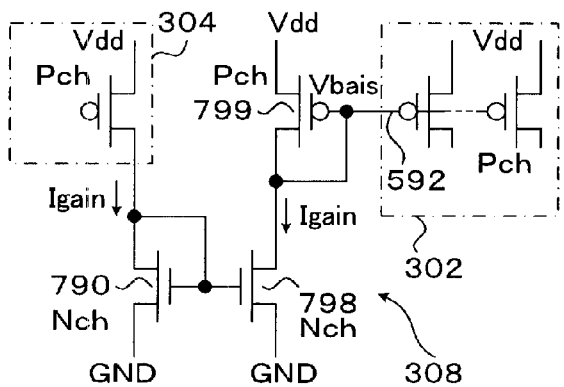

Also, in FIG. 4D, an NMOS transistor 798 connected to the transistor 790 in current mirror and a PMOS transistor 799 receiving the current output from the NMOS transistor 798 are provided. The additional current is supplied to the drain of the transistor 799, the drain and the gate are connected, and the source is connected to a power source line. The gate (also drain) of the transistor 799 and the gate of the PMOS transistor constituting each current-source cell disposed at the first DA conversion section 302 are commonly connected. A bias voltage Vbais in accordance with the additional current occurs at the gate (also drain) of the PMOS transistor 799. This bias voltage Vbais is supplied to the current control line 592 commonly connected to the gate of the PMOS transistor constituting each current-source cell disposed at the first DA conversion section 302.

In any of the configurations, in operation, the gain adjustment current-source cell 308 functions as a current/voltage conversion section which converts the additional current Igain generated by the second DA conversion section 304 into a voltage signal (bias voltage Vbais) and controls the operation current value of each current-source cell of the first DA conversion section 302 on the basis of the converted voltage signal.

Figure 9:
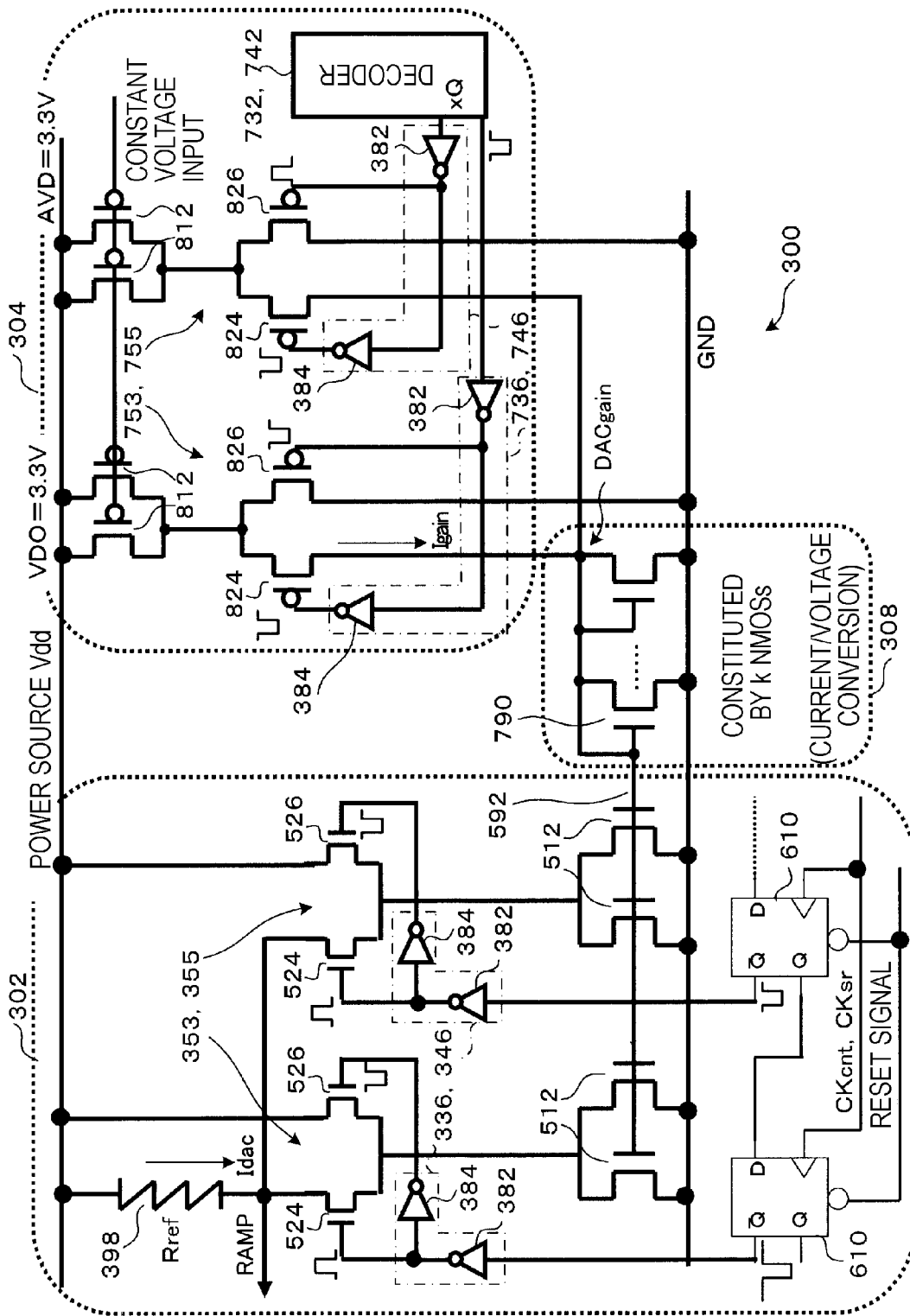
FIG. 9 is a diagram illustrating the details of the connection between the first DA conversion section and the second DA conversion section.

In this regard, as shown in FIG. 9 described below, it is advantageous to employ the configuration in which the first DA conversion section 302 as the slope section includes an NMOS, the second DA conversion section 304 includes a PMOS, and the bias voltage is turned back by the circuit output of the PNOM. The reasons for this is as follows. Firstly, in order to make an NMOS gate voltage, it is necessary to output from a PMOS.

Secondly, the configuration is tolerant of variations. A more detailed description on the second point is as follows. If the temperature goes up and the performance of the transistor decreases, the voltage Vgs across the gate and the source becomes large in order to flow the same current while the output from the amplifier is kept constant. This output is turned back by the NMOS to be input, and thus it is possible to keep the same output as that of room temperature. Also, if there are differences in the performance between the transistors of NMOS and PMOS caused by process variations, stable output can be obtained for the same reason as described above.

The output current Igain of the second DA conversion section 304 increased (combined) at the DAC output terminal DACgain is received by the gain adjustment current-source cell 308 functioning as a current/voltage conversion section. The gain adjustment current-source cell 308 is provided with a transistor 790 (or transistor 792), and the gate and the drain thereof are connects.

The first DA conversion section 302 has a configuration of a current-output type DA conversion circuit. The output voltage (bias voltage Vbais) of the gain adjustment current-source cell 308 functioning as a current/voltage conversion section is supplied to the gate, the control input terminal of the current-source cell thereof.

On the whole, the PMOS transistor constituting the current-source cell of the second DA conversion section 304 and the NMOS transistor constituting the current-source cell of the first DA conversion section 302 are used by being turned back, and thus the circuit becomes tolerant of variations.

Thereby, it becomes possible to achieve a DA conversion circuit operating at arbitrarily set gain by setting the operation current of each current-source cell in the current-source cell section 350 by digital control. For example, it becomes possible to vary the gain from −3 dB to 20 dB by adjusting the operation current of each current-source cell. By controlling the current-source cell section 350 using a digital signal, the DA conversion section 30 can operate as a DA conversion circuit capable of the analog output of a desired input digital signal Din at a desired gain.

Also, although the details will be described later, in particular, the second DA conversion section 304 of the present embodiment has a great characteristic in that the slope per clock (ΔRAMP) at the DA conversion in the first DA conversion section 302 is adjusted by the digital-control driving current-source cell for adjusting the amount of current for controlling the amount of operation current of each current-source cell, which is an example of unit current-source cell disposed in the current-source cell section 750.

It becomes possible to adjust the amount of additional current in the current-source cell section 350 with 12-bit precision as a result by performing digital control with, for example 12-bit precision. This means that when performing the single-slope integration type AD conversion, digital data is obtained from the pixel signal to be processed with an analog gain adjusted with high precision, i.e., 12-bit.

Also, the second DA conversion section 304 can control the operation current on each current-source cell of the current-source cell section 350 uniformly using current mirror with the gain adjustment current-source cell 308. Thus, it becomes possible to uniformly gain adjust on each current-source cell of the current-source cell section 350 individually by the control on one place (here, gain adjustment current-source cell 308).

The precision of the amplitude control of the reference voltage is determined by the digital adjustment precision of the second DA conversion section 304 as gain adjustment DA conversion circuit by digital input. It is, of course, possible to directly enter from the outside the digital input (input code) Dgain for setting a gain for the second DA conversion section 304.

Configuration of First DA Conversion Section

Figure 5:
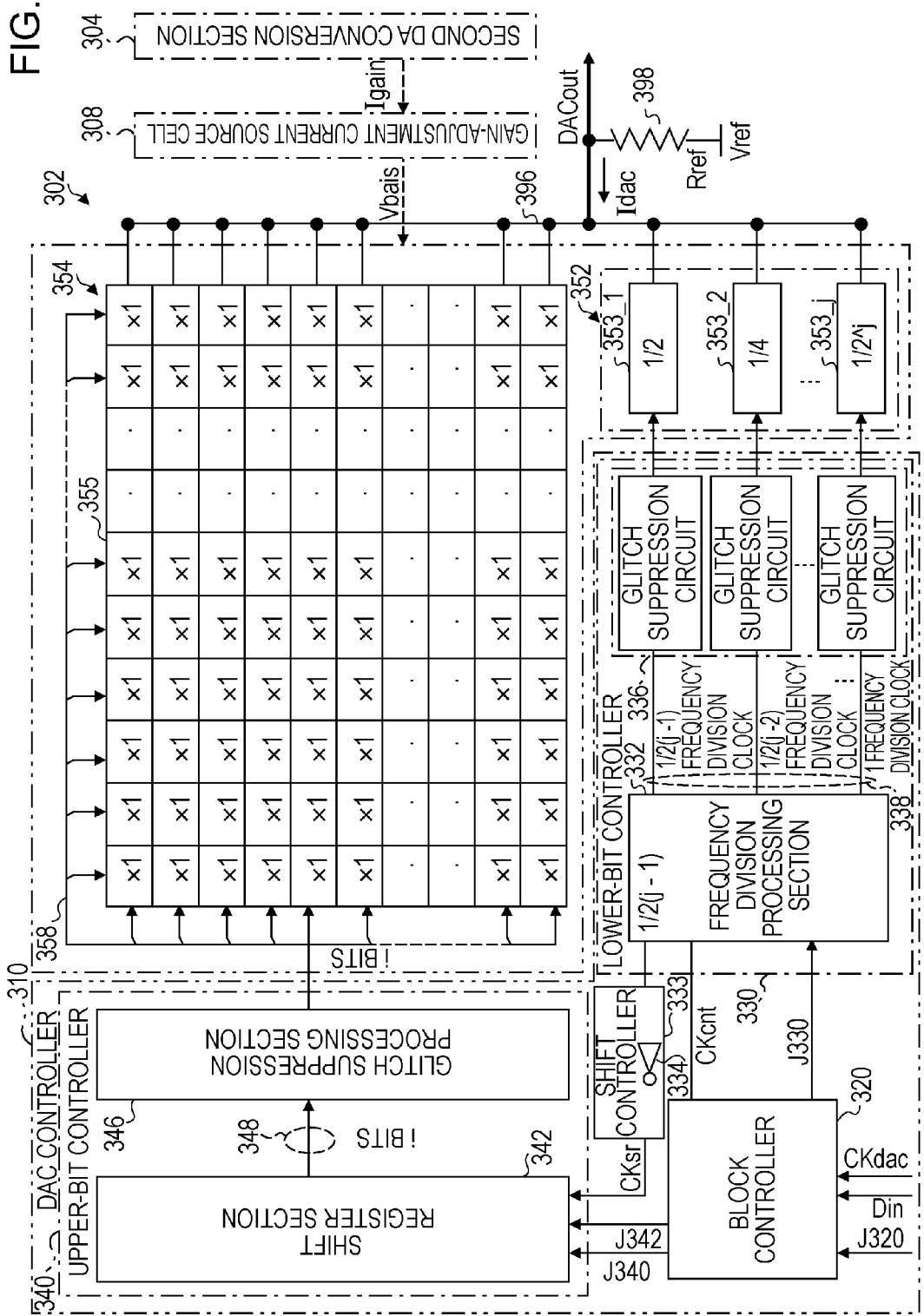
FIG. 5 is a diagram illustrating an example of a specific configuration of a first DA conversion section.

FIG. 5 is a diagram illustrating an example of a specific configuration of the first DA conversion section 302. As shown in the figure, the first DA conversion section 302 includes a first DAC controller 310 which controls the entire first DA conversion section 302 and has a function of constant current-source selection control section and the current-source cell section 350 including a plurality of current-source cells (constant current source).

The DAC controller 310 includes a block controller 320 for controlling the operation of each section in the DAC controller 310, a lower-bit controller 330, which is disposed at the input stage of the input digital signal Din to be processed and performs the control processing of the lower bits, and a upper-bit controller 340, which is disposed at the input stage of the input digital signal Din to be processed and performs the control processing of the upper bits.

The current-source cell section 350 has a lower-current-source cell section 352 having a plurality of kinds of lower-current-source cells 353 for outputting a predetermined weight current, and a upper-current-source cell section 354 having upper-current-source cells 355 disposed in a matrix and for individually outputting a predetermined same weight current.

The lower-current-source cell section 352 includes j lower-current-source cells 353 disposed in parallel for taking charge of lower j bits, each of which corresponds to each one bit of the lower bits of the digital input signal. The output end of the lower-current-source cells 353 is connected to the selection output line 396 for combining the output current of each of the lower-current-source cells 353. The selection output line 396 is connected to a DAC output terminal DACount.

The current value of each lower-current-source cell 353 of the lower-current-source cell section 352 is individually weighted by ½, ¼, . . . , ½^j with respect to the current value of each upper-current-source cell 355 of the upper-current-source cell section 354. Each lower-current-source cells 353 is individually selected by the lower-bit controller 330 depending on the logic value ("1" or "0") of individual bit of the lower j bits of the input digital signal Din. The output current of the lower-current-source cell 353 selected by the lower-bit controller 330 on the basis of the lower j bits of the input digital signal Din is additionally output at the DAC output terminal DACout by a reference resistor 398 one end of which is connected to the reference voltage Vref.

The upper-current-source cell section 354 includes at least $2^i$ (preferably ($2^i$)+y (y is arbitrary)) upper-current-source cells 355 which takes charge of the upper i bits and are disposed in a matrix. Matrix selection lines 358 corresponding to the matrix disposition of the upper-current-source cell 355 are provided in the surroundings of the upper-current-source cell section 354 in order to select each upper-current-source cell 355.

In the upper-current-source cell section 354, a number of upper-current-source cells 355 corresponding to the upper-bit data value of the digital input signal are selected by the upper-bit controller 340. The output current of the selected upper-current-source cell 355 is additionally output at the DAC output terminal DACout in the same manner as the lower-current-source cell section 352. The output voltage of the DAC output terminal DACount is specified by the product of the additional current Idac and the resistance value Rref of the reference resistor 398.

The block controller 320 controls the upper-bit controller 340 and the lower-bit controller 330 on the basis of the multiple-bit digital signal Din supplied from the communication/timing controller 20. In one example, the upper i bits are decided into a decimal value, and the shift registers in the shift register section 342 on the basis of the decoded value.

Also, various control signals J320 for controlling the DAC mode, the start of DAC, or the DAC resolution, etc., are input into the block controller 320. The block controller 320 supplies a control signal J330 for controlling the lower-bit controller 330, and supplies a control signal J340 for controlling the upper-bit controller 340 on the basis of the input digital signal Din (for example, a decode value) and the control signals J320.

The control signal J330 includes, for example a reset signal for resetting the output of the frequency division processing section 332 to a certain logic level (here, a clear value). Also, the control signal J340 includes, for example a reset signal and a set signal for resetting and setting the output of the shift register section 342 to a certain logic level (here, a clear value and a full value).

Also, the count clock CKdac for DA conversion is supplied to the block controller 320 from the communication/timing controller 20 as an external clock. The block controller 320 shapes this count clock CKdac to supply to the lower-bit controller 330 as the internal count clock CKcnt.

Also, in order to specify the digital resolution (for example, "i" of i bits) of the DA conversion by specifying the use number of the upper-current-source cells 355 of the upper-current-source cell section 354, the block controller 320 supplies the control signal J342 for that control to the upper-bit controller 340. For this control signal J342, for example an enable signal for controlling the activation of each shift register can be used. When the enable signal to be supplied to the output enable (OE) terminal of each shift register is set to active, the output of each shift register becomes effective. It is possible to control the activation of each shift register by setting the enable signal to inactive to invalidate the output of each shift register (for example, maintaining the noninverted output terminal Q at an L level, and the inversion output terminal xQ at an H level).

For example, in the upper-current-source cell section 354 having the upper-current-source cell 355 for i bits ($2^i$ pieces) as a maximum resolution, when the resolution is purely controlled per bit, in the case of using a resolution of x ($x \leq i$) bits, the control is performed so that only the $2^x$ upper-currentsource cells 355 are activated. In this case, the control signal J342 needs i lines (control signals J342_1 to _i).

The control signal J342_1 controls the activation of the first upper-current-source cell 355, and the control signal J342_2 controls the activation of the second to the 2^2nd upper-current-source cells 355. In the following, in the same manner, the control signal J342_1 to _x are used to control the activation of 1+2^(x−1)th to 2^xth upper-current-source cells 355. That is to say, the upper-current-source cells 355 of the total number 2^i (may include +y) are divided into x blocks, and only the upper-current-source cells 355 corresponding to a predetermined requested digital resolution are selected to be used.

The lower-bit controller 330 includes a frequency division processing section 332 having a counter (namely, a frequency divider for dividing the frequency of a clock) which counts the internal count clock CKcnt supplied from the block controller 320, and a glitch suppression processing section 336 having a plurality of glitch suppression circuits for suppressing the glitches that might appear on the output of the first DA conversion section 302. The same number (j pieces) of glitch suppression circuits are provided as the number of the lower-current-source cells 353 disposed in the lower-current-source cell section 352.

The frequency division processing section 332 is provided in order to allow the DA conversion corresponding to 1 LSB during one clock period. Specifically, the frequency division processing section 332 has a D flip-flop (a latch; called a D-FF in the following) as a basic element, has (j−1) frequency dividers for generating divisions by a power of two, and supplies virtually the divide-by-1 frequency division clock of the count clock CKcnt itself, and the lower-bit binary output of the (j−1) bits produced by the frequency dividers, namely ½, ¼, . . . , ½^(j−1) frequency division clocks to the corresponding glitch suppression circuit in the glitch suppression processing section 336 as a selection control signal. That is to say, the frequency division processing section 332 supplies ½^k (k is from 0 to j−1) frequency division clock, which becomes the output corresponding to the binary data of the lower j bits, to the glitch suppression processing section 336 j-k. The frequency division processing section 332 functions as a selector for the j lower-current-source cells 353 disposed in the lower-current-source cell section 352.

The glitch suppression processing section 336 performs the glitch suppression processing on each frequency division clock by each glitch suppression processing circuit, and then supplies it to the corresponding lower-current-source cells 353 in the lower-current-source cell section 352 such that ½^k (k is from 0 to (j−1)) frequency division clock is supplied to the current-source cell having ½^(j−k) current value. For example, divide-by-1 frequency division clock is connected to the lower-current-source cells 353_j having ½^j current value, ½ frequency division clock is connected to the lower-current-source cells 353_j−1 having ½^(j−2) current value, ¼ frequency division clock is connected to the lower-current-source cells 353_j−2 having ½^(j−2) current value. In the following, in the same manner, ½^(j−2) frequency division clock is connected to the lower-current-source cells 353_2 having ¼ current value, and ½^(j−1) frequency division clock is connected to the lower-current-source cells 353_1 having ½ current value.

Here, although the figure is omitted, the glitch suppression processing section 336 includes a logic inversion (phase inversion) function for the input signals and a delay means having a predetermined amount Δt of delay function. The glitch suppression processing section 336 supplies the input signal, which is not delayed by the delay means, and the inverted signal, which is delayed by the delay means, as complementary signals, to each complementary input terminal (here, the gate terminal of the transistors 524 and 526) of the differential switch constituting the current-source cells 353 and 355.

When complementary signals are simply supplied into individual complementary input terminals of a differential switch, if the inputs to the transistors 524 and 526 operating as a differential switch constituting the current-source cells 353 and 355 become an L level together and an off together because of the variations (delay difference) in time of complementary input to the differential switch, there is the case where the transistor 524 related to the DA conversion output on the selection output line 396 turns on from an off state. At this time, a glitch might occur. This is because when the transistors 524 and 526 are both in an off state, the output current from the current-source cell is completely zero, and the output current is attempted to occur suddenly by activating the current-source cell from such a state.

In contrast, when the control is performed on the transistors 524 and 526 operating as a differential switch of the current-source cells 353 and 355 through the glitch suppression processing section 336, the gate input to the transistor 526 is activated (a high level) or inactivated (a low level) after a delay Δt period, and thus in the process of the inactivation of the transistor 526 with the delay of Δt seconds after the activation of the transistor 524, it is possible to reliably prevent a state of turning on the transistor 524 from the off state of both of the transistors 524 and 526. Accordingly, it is possible to suppress the occurrence of glitches (for details, refer to FIG. 9 below).

Also, the lower-bit controller 330 has a number of selection lines 338 corresponding to the number of lower-current-source cells 353 in order to select each lower-current-source cells 353 of the lower-current-source cell section 352. By selecting a selection line 338, a lower-current-source cells 353 corresponding to the lower-bit data value of the digital input signal is selected. In this example of the configuration, the glitch suppression processing section 336 is disposed on the selection line 338 between the frequency division processing section 332 and the lower-current-source cell section 352.

The glitch suppression processing section 336, the details of which will be described later, outputs the positive logic output Q and the negative logic output xQ from individual output terminals (in the following, also called output complementarily) substantially at the same time on the basis of the frequency division clock from the frequency division processing section 332. For the selection lines 338, two selection lines are connected to each lower-current-source cells 353 (in detail, the input terminal of the differential switch) correspondingly.

Also, the lower-bit controller 330 includes a shift controller 333 which supplies a signal indicating a carry or a borrow to the shift register section 342 of the upper-bit controller 340 as a shift clock CKsr. For example, the shift controller 333 includes an inverter 334 has a buffer function of logically inverting the ½^(j−1) frequency division clock in the lower-bit binary output of the frequency division processing section 332 in order to produce the shift clock CKsr indicating a carry. The frequency division processing section 332 inverts the phase of the ½^(j−1) frequency division clock through the inverter 334, uses one of the change edges, and supplies the clock to the upper-bit controller 340 ad the shift clock CKsr.

Of course, such a configuration of the shift controller 333 is one example. For example, it is possible to use a carry pulse that can be generated at up-count operation time as the shift clock CKsr indicating a carry. Alternatively, it is possible to use a borrow pulse that can be generated at down-count operation time as the shift clock CKsr indicating a borrow.

The upper-bit controller 340 includes a shift register section 342 having shift registers for upper i bits ($2^i$), and a glitch suppression processing section 346 having a plurality of glitch suppression circuits for suppressing the glitches that might appear on the output of the first DA conversion section 302. The same number ($2^i$) of glitch suppression circuits are provided as the number of the upper-current-source cells 355 disposed in the upper-current-source cell section 354. The shift clock CKsr is supplied to the shift registers 342 from the lower-bit controller 330.

The shift registers 342 is provided in order to allow the DA conversion corresponding to each data value of the upper i bits. Specifically, the shift registers 342 has shift registers vertically connected so as to sequentially correspond to the digital signals of the upper i bits, and outputs the data value produced by decoding the upper i bits of the input digital signal into a decimal value by activating the shift output terminals in sequence in a predetermined direction on the basis of the shift clock CKsr supplied from the lower-bit controller 330.

Each shift output of the shift register is individually supplied to the corresponding glitch suppression circuit in the glitch suppression processing section 346 as a selection control signal. The glitch suppression processing section 346 performs the glitch suppression processing on each shift output by each glitch suppression processing circuit, and then supplies it to the corresponding upper-current-source cells 355 in the upper-current-source cell section 354.

Also, the upper-bit controller 340 has a number of matrix selection lines 348 (correspond to the matrix selection lines 358) corresponding to the number of upper-current-source cells 355 in order to select each upper-current-source cells 355 of the upper-current-source cell section 354. By selecting a matrix selection line 348, a upper-current-source cells 355 corresponding to the upper-bit data value of the digital input signal is selected. In this example of the configuration, the glitch suppression processing section 346 is disposed on the matrix selection line 348 between the shift register section 342 and the upper-current-source cell section 354.

In the same manner as the glitch suppression processing section 336, the glitch suppression processing section 346 outputs complementarily on the basis of the shift output which is output from the shift register section 342. For the matrix selection lines 358 disposed in the surroundings of the upper-current-source cell section 354, two selection lines are connected to each upper-current-source cells 355 (in detail, the input terminal of the differential switch) corresponding to each of the outputs Q and xQ.

In this regard, in the shift register section 342, the control signals J342_1 to _i, which are supplied from the block controller 320 for digital resolution control, are supplied to the output enable terminals of the shift registers using a D-FF as a basic element. For example, when used with x-bit (x≦i) resolution, only $2^x$ shift registers are activated.

The control signal J342_1 controls the activation of the first shift register, and the control signal J342_2 controls the activation of the second to the $2^2$nd shift registers. In the following, in the same manner, the control signals J342_1 to _x are used to control the activation of $1+2^{(x-1)}$th to $2^x$th shift registers. That is to say, the shift registers of the total number $2^i$ (may include +y) are divided into x blocks, and only the shift registers corresponding to a predetermined requested digital resolution are selected. Thus, only the upper-current-source cells 355 corresponding to a predetermined requested digital resolution are used.

Of course, the digital resolution can be controlled by any value z without controlling by each bit. For example, if the upper i bits are 7 bits, any value y is 8, and z used for dividing the block by 4 shift registers is 34, the control signals corresponding to a preset desired digital resolution are input into the shift register per z.

The upper-bit controller 340 performs the DA conversion for the upper-bit data by selecting the number of upper-current-source cells 355 corresponding to the upper-bit data value of the digital input signal. At this time, the control is performed so that only the number of shift registers and the upper-current-source cells 355 corresponding to the digital resolution are activated, and thus the DA conversion will not be virtually performed after the point in time when the set digital resolution has been attained. That is to say, the upper-bit controller 340 starts the DA conversion based on the upper-bit data on the basis of the shift clock CKsr supplied from the lower-bit controller 330, and the DA conversion is automatically stopped at the point in time when a desired digital resolution is attained.

The shift register section 342 activates the shift output terminals of the shift registers connected vertically in sequence in a predetermined direction on the basis of the shift clock CKsr supplied from the lower-bit controller 330. Here, "a predetermined direction" is a direction of the shift operation which activates one of the upper-current-source cells 355 when the lower-bit controller 330 operates to produce a carry, and the shift clock CKsr indicating a carry is supplied. On the other hand, when the lower-bit controller 330 operates to produce a borrow and the shift clock CKsr indicating a borrow is supplied, the shift operation is performed in the direction to inactivate the upper-current-source cell 355 of the last stage inactivated at that point in time.

It is possible to generate the analog voltage in accordance with a desired digital resolution by performing, in series, such an operation on the shift registers corresponding to the number of the setting (activation) to be available in advance. For the shift registers not activated, even if an active edge of the shift clock CKsr is input into the clock input terminal CK, the noninverted output terminal Q is kept at an L level, and the inverted output terminal xQ is kept at an H level regardless of the state of the noninverted output terminal Q of the preceding stage. Thus, it is possible to virtually stop the DA conversion after the point in time when the set digital resolution is attained. Accordingly, the DA conversion on the upper bits virtually stops at the point in time when the desired digital resolution is attained.

For example, the digital resolution is determined to be 7 bits, when the $2^7$th shift register turns on, the DA conversion by the upper-bit controller 340 and the upper-current-source cell section 354 stops. Also, it is possible to stop the DA conversion on the upper bits by stopping the shift clock CKsr from the lower-bit controller 330 when the upper bit data of the desired input digital value (display code) is attained.

It is possible to generate a reference signal having the voltage level of the DAC output terminal DACout changing monotonously and little by little by combining the output current of each of the current-source cells 353 and 355 appearing on the selection output line 396 until the DA conversion stops and converting the current into the voltage by the reference resistor 398. Thus, it becomes possible to produce a DA converter which is preferable for generating a reference signal used at the time of the AD conversion by a so-called single-slope integration type (or a ramp-signal comparison type).

Also, the DA conversion section 300 of the present embodiment can be used not only for the DA converter for generating a reference signal voltage used for the single-slope integration type AD conversion, but for a general DA converter. For example, if the voltage level of the DAC output terminal DACout in a state in which the DA conversion processing at the time of attaining to the value corresponding to the input digital signal is used, it is possible to obtain the analog co corresponding to the input digital signal. As a result, it is possible to perform the DA conversion on a multiple-bit input digital signal.

In this regard, the setting of the stop timing in the previous example is described only on the upper bits, and thus it is not possible to compensate the precision for the lower bits without change. However, for the lower bits as well, it is possible to stop the DA conversion processing on the lower bits by stopping the internal count clock CKcnt at the time of attaining the value corresponding to the lower j bits of the input digital signal when the upper bits have attained the data to be stopped. In this case, by using the voltage level of the DAC output terminal DACout in a state in which the DA conversion processing at the time of attaining to the value corresponding to the multiple-bit input digital signal, it is possible to obtain the analog voltage correctly corresponding to the multiple-bit input digital signal. As a result, it becomes possible to perform DA conversion with high precision on a multiple-bit input digital signal.

Configuration of Second DA Conversion Section

Figure 6:
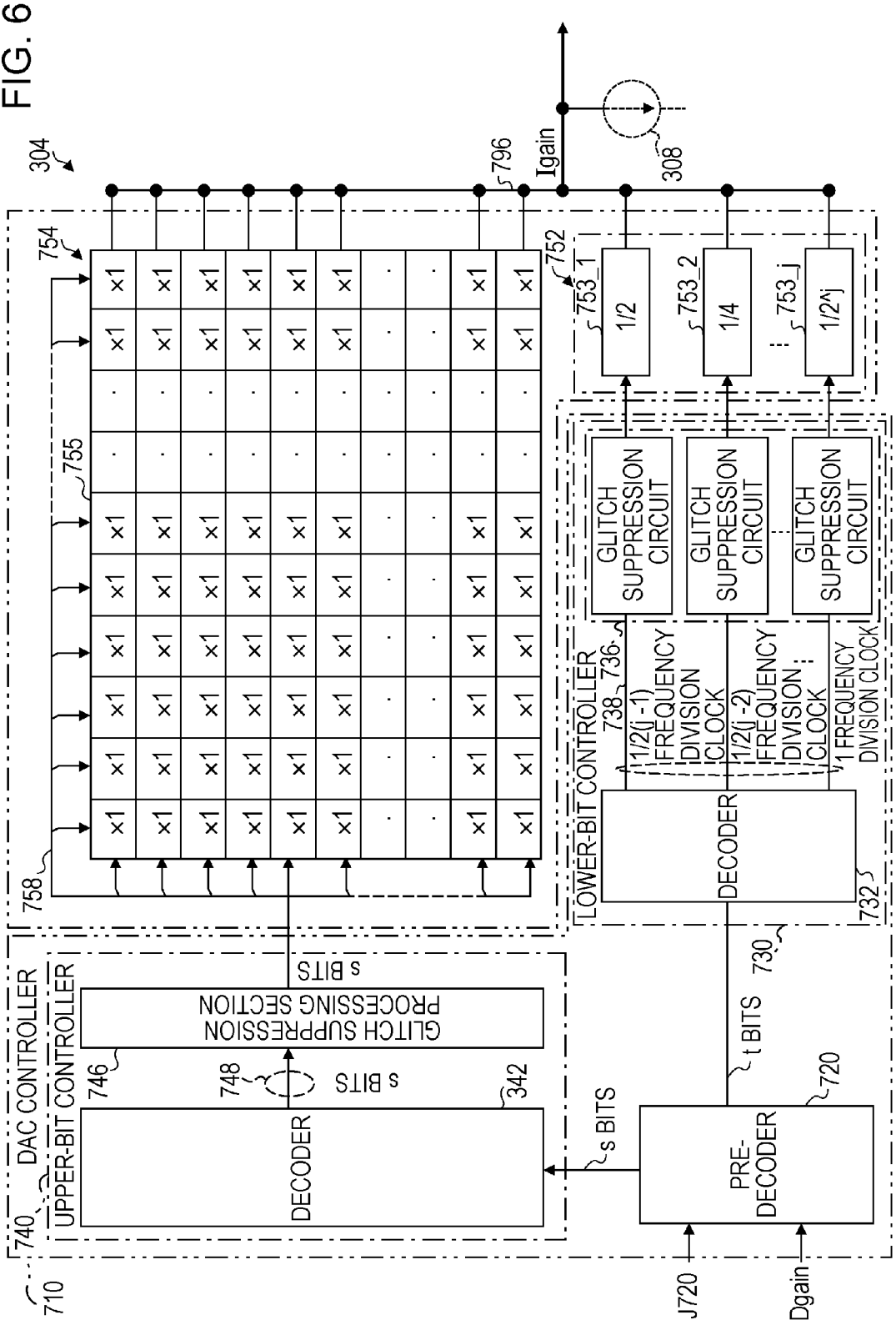
FIG. 6 is a diagram illustrating an example of a specific configuration of a second DA conversion section.
Figure 7:
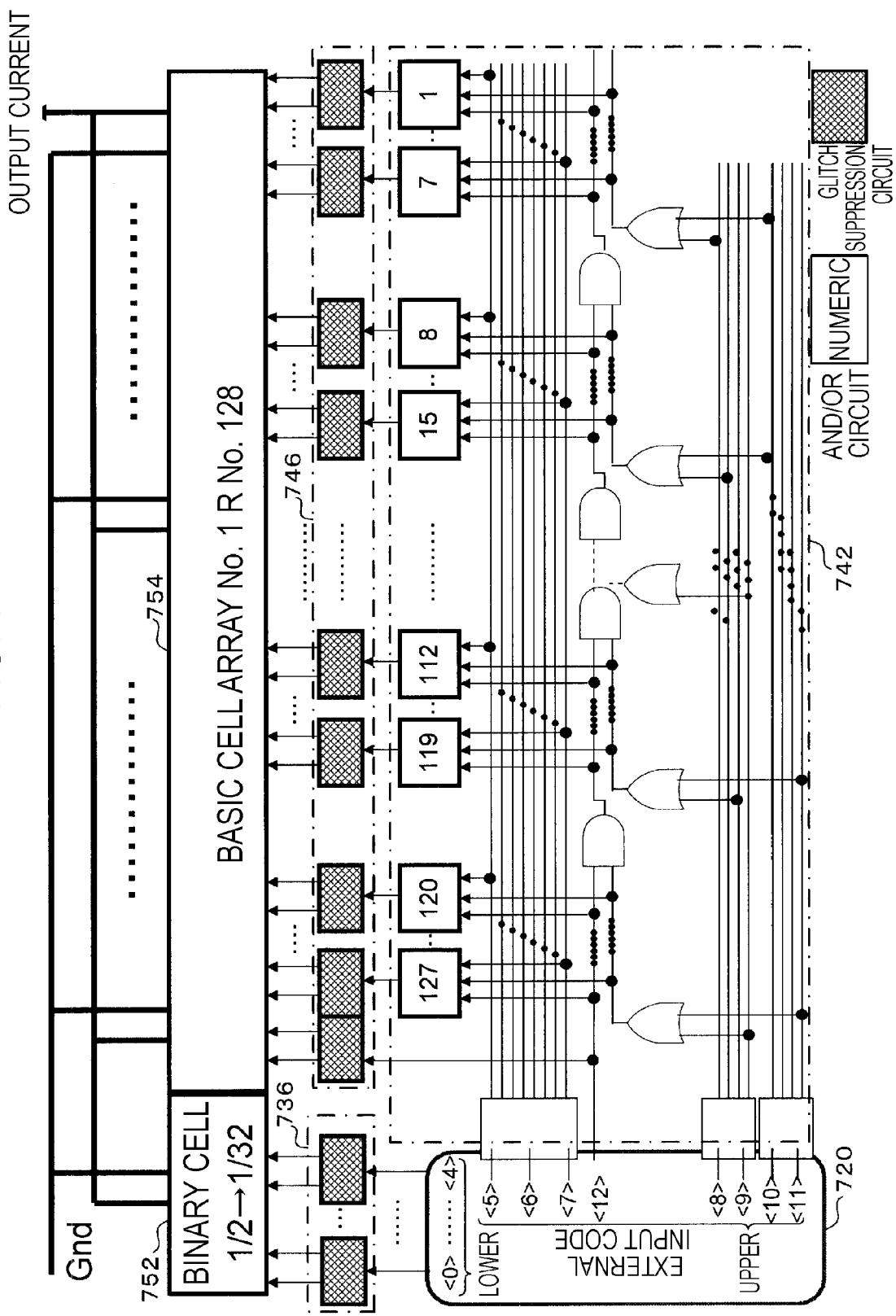
FIG. 7 is a diagram illustrating a relationship between an external input code and a current source cell.

FIGS. 6 and 7 are diagrams illustrating an example of a specific configuration of the second DA conversion section 304. Here, FIG. 6 is a diagram illustrating an example of the configuration of the second DA conversion section 304. FIG. 7 is a diagram illustrating a relationship between an external input code and a current-source cell.

As shown n FIG. 6, the second DA conversion section 304, which is a characteristic part of the present embodiment, includes a DAC control section 710 which controls the entire second DA conversion section 304 and has a function of constant current-source selection control section, and a current-source cell section 750 having the same configuration as the current-source cell section 350 including a plurality of current-source cells (constant current source). The DAC control section 710 includes a function as a current setting section which sets the operation current of each current-source cell in the current-source cell section 302 related to the amplitude of the reference signal generated in the first DA conversion section 302. Digital signal of m bits are characteristically divided into the upper s bits and the lower t bits (m=s+t) to be controlled.

For example, the DAC controller 710 includes a pre-decoder 720 which controls the operator of each section in the DAC control section 710, a lower-bit controller 730 which is disposed at the input stage of the gain-setting input code (digital gain-control input signal) Dgain to be processed, and takes charge of the control processing of the lower t bits, and an upper-bit controller 740 which is disposed at the input stage of the gain-setting input code Dgain to be processed and takes charge of the control processing of the upper s bits.

The current-source cell section 750 corresponds to the current-source cell section 350, the lower-current-source cell section 752 corresponds to the lower-current-source cell section 352, the lower-current-source cells 753 corresponds to the lower-current-source cells 353, the upper-current-source cell section 754 corresponds to the upper-current-source cell section 354, and the upper-current-source cell 755 corresponds to the upper-current-source cell 355. The configuration and the allocation of weight on the output current of the current-source cell section 750 is the same as those of the current-source cell section 350, n should be replaced by m, and i should be replaced by s and j.

The output terminals of the lower-current-source cells 753 are connected to the selection output line 796 for combining the output current of each of the lower-current-source cells 753. The selection output line 796 is connected to the DAC output terminal DACgain, and the output current of the selected lower-current-source cell 753 in the lower-current-source cell section 752 is added and output at the selection output line 796. Also, the output current of the selected upper-current-source cell 755 in the upper-current-source cell section 754 is added and output at the selection output line 796 in the same manner as the lower-current-source cell section 752. As shown in FIG. 5, the gain adjustment current-source cell 308 is connected to the DAC output terminal DACgain.

The communication/timing controller 20 supplies the control signal J720 includes the DAC-mode change signal, etc., and gain-setting input code Dgain to the pre-decoder 720. The pre-decoder 720 divides the input m-bit gain-setting input code Dgain into the upper s-bit information and the lower t-bit information. Thus, the pre-decoder 720 outputs the lower t-bit information in the m-bit digital signal to the lower-bit controller 730, and the upper s-bit information in the m-bit digital signal to the upper-bit controller 740.

The lower-bit controller 730 includes a decoder 732 which generates a selection control signal for selecting each lower-current-source cells 753 of the lower-current-source cell section 752 on the basis of the lower t-bit information supplied from the pre-decoder 720 and a glitch suppression processing section 736 having a plurality of glitch suppression circuits for suppressing the glitches that might appear on the output of the second DA conversion section 304. The glitch suppression circuits are the same as those in the glitch suppression processing section 336. The same number (t pieces) of glitch suppression circuits are provided as the number of the current-source cells 753 disposed in the lower-current-source cell section 752.

The decoder 732 directly outputs the lower t-bit information passed from the pre-decoder 720 to be used for the selection control signal for selecting each lower-current-source cells 753 of the lower-current-source cell section 752. For the lower bits, current-source cells (binary cells) weighted by two bits are provided.

That is to say, the decoder 732 is provided in order to allow the DA conversion corresponding to 1 LSB on the basis of t-bit data supplied from the pre-decoder 720. Specifically, the decoder 732 employs a binary control method of supplying the lower-bit binary output of the (t−1) bits produced by the frequency dividers, namely ½, ¼, . . . , ½^(t−1)-bit data to the corresponding glitch suppression circuit in the glitch suppression processing section 736 as a selection control signal. The decoder 32 functions as a selector for the t lower-current-source cells 753 disposed in the lower-current-source cell section 752.

The upper-bit controller 740 includes a decoder 742 which generates a selection control signal for selecting each upper-current-source cells 755 of the upper-current-source cell section 754 on the basis of the upper s-bit information supplied from the pre-decoder 720 and a glitch suppression processing section 746 having a plurality of glitch suppression circuits for suppressing the glitches that might appear on the output of the second DA conversion section 304. The glitch suppression circuits are the same as those in the glitch suppression processing section 346. The same number (2^t pieces) of glitch suppression circuits are provided as the number of the current-source cells 755 disposed in the upper-current-source cell section 754.

The decoder 742 performs the full-decoding (data conversion) of the upper s-bit multiple-bit digital signal supplied from the pre-decoder 720 into a decimal value, and outputs the decoded value as a selection control signal for selecting each upper-current-source cell 755 of the upper-current-source cell section 754. The decoder 742 functions as a selector for the 2^s upper-current-source cells 755 disposed in the upper-current-source cell section 754.

Each output of the decoder 742 is individually supplied to the corresponding glitch suppression circuit in the glitch suppression processing section 746 as a selection control signal. The glitch suppression processing section 746 performs the glitch suppression processing on each output by each glitch suppression processing circuit, and then supplies it to the corresponding upper-current-source cells 755 in the upper-current-source cell section 754.

Specifically, as shown in FIG. 7, out of the m-bit digital code set from the outside, the upper s bits are decoded into a thermostat type by the decoder 742, and are input into the upper-current-source cell section 754 of the current-output type DA converter (second DA conversion section 304). In the thermostat type, for example, if the input code is 7 bits, the decoded output is connected to 2^7−1=127 current-source cells. The method of connection is such that if the input is "0000001", one current-source cell turns on, if the input is "0000100", eight current-source cell turn on, and if the input is "1111111", 127 current-source cell turn on. On the other hand, as described before, the lower t bits are input into the lower-current-source cell section 752 having a direct binary-cell configuration. Accordingly, the current value proportional to the external input code is output as the output current.

The second DA conversion section 304 having such a configuration divides digital signal of m bits into the upper s bits and the lower t bits (m=s+t). For upper s bits, the upper-current-source cell section 754 having the configuration of matrix-type current-source cells weighted uniformly is used in order to generate current value weighted in the same manner for the upper-current-source cells 755, and the upper-bit controller 740 controls the upper-current-source cell section 754 in a decimal decoding method. For the lower bits, the lower-current-source cell section 752 having the configuration of parallel-type current-source cells weighted in order to have weight divided by a power of two is used in order to generate current value weighted divided by a power of two for the lower-current-source cells 753, and the lower-bit controller 730 controls the lower-current-source cell section 752 in a binary method.

That is to say, in order to count bits reliably at a high speed, in the DA conversion section 300 including such a first DA conversion section 302 and a second DA conversion section 304, the first DA conversion section 302 divides the necessary bits into the upper i bits and the lower j bits using the frequency division processing section 332 operating as a clock counter and the upper-bit controller 340. For the lower j bits, the frequency division processing section 332 generates one-to a power of two, and the frequency division processing section 332 functioning as a selector on the j lower-current-source cells 353 disposed in the lower-current-source cell section 352 selectively drives the lower-current-source cells 353 of the lower-current-source cell section 352. Also, for the upper j bits, the upper-current-source cell 355 of the upper-current-source cell section 354 is selectively driven by activating/inactivating the shift register of the upper-bit controller 340 per clock in a predetermined direction on the basis of the shift clock CKsr from the frequency division processing section 332.

Thus, the lower-current-source cell section 352 controlled by a binary counter method and the upper-current-source cell section 354 controlled by a decoding method are operated in a coordinated manner, and thus even if the digital signal becomes high speed, the current-source cell section 350 divided into the binary method and the decode method can be operated substantially at the same time. As a result, it becomes possible to reliably select the current-source cells 353 and 355 corresponding to the input digital signal at a high speed. Thereby, it is possible to prevent the glitch occurrence and the miscoding occurrence at the time of high-speed operation, and thus to perform a stable DA conversion operation.

That is to say, the first DA conversion section 302 of the present embodiment divides digital signal of n bits into the upper i bits and the lower j bits (n=i+j). For upper bits, the upper-current-source cell section 354 having the configuration of matrix-type current-source cells weighted uniformly is used in order to generate current value weighted in the same manner for the upper-current-source cells 355, and the upper-bit controller 340 controls the upper-current-source cell section 354 in a decoding method. For the lower bits, the lower-current-source cell section 352 having the configuration of parallel-type current-source cells weighted in order to have weight divided by a power of two is used in order to generate current value weighted divided by a power of two for the lower-current-source cells 353, and the lower-bit controller 330 controls the lower-current-source cell section 352 in a binary counter method.

The internal shift register in the upper-bit controller 340 is shift operated in a direction corresponding to a carry or a borrow in coordination with a carry or a borrow in the lower-bit controller 330, and thus the selection operation of the lower-current-source cells 353 corresponding to the lower part of the input digital value and the upper-current-source cells 355 for the upper part is characteristically performed substantially at the same time. Thus, the glitch occurrence and the miscoding occurrence are prevented, a stable analog signal is obtained, and thus the improvement is made in the conversion precision of the single-slope-integration type AD conversion using the analog reference signal.

In addition, when the single-slope-integration type AD conversion is performed using the reference signal generated by the first DA conversion section 302, the second DA conversion section 304 performs digital control on the operation current of each of the current-source cells 753 and 755 of the current-source cell section 750. Thus, digital data is characteristically obtained with high-precision adjustment on the analog gain of the pixel signal to be processed.

In particular, the output precision at the power source can be made high by configuring the current-source cells of the first DA conversion section 302 as the slope-type DA conversion section using NMOSs, and by configuring the current-source cells of the second DA conversion section 304 as the PGA section using PMOSs. In view of the pixel signal, this corresponds to the low illuminance side. Accordingly, the precision of the slope-type DA conversion section including the NMOS current-source cells becomes reliable, and thus this configuration is suitable for a solid-state element. The reason why the output precision at the power source becomes high is that the transistors constituting operation switches and the current-source cells operates stably usually at the power source side in a saturated state. Also, in order for the output current of the first DA conversion section 302 including the NMOS current-source cells not to be dependent on the process variations and temperature, it is possible to build a complementary relationship by giving the voltage generated by the PMOS current-source cells in the second DA conversion section 304. That is to say, in order to ensure the precision at the low illuminance side and to be resistant to variations, it is highly advantageous to configure the current-source cells of the first DA conversion section 302 using NMOSs.

In the following, a specific description will be given of the details on the main functional sections related to the second DA conversion section 304 and the details of the operation thereof.

Basic Configuration of Current-Source Cell

Figure 8A:
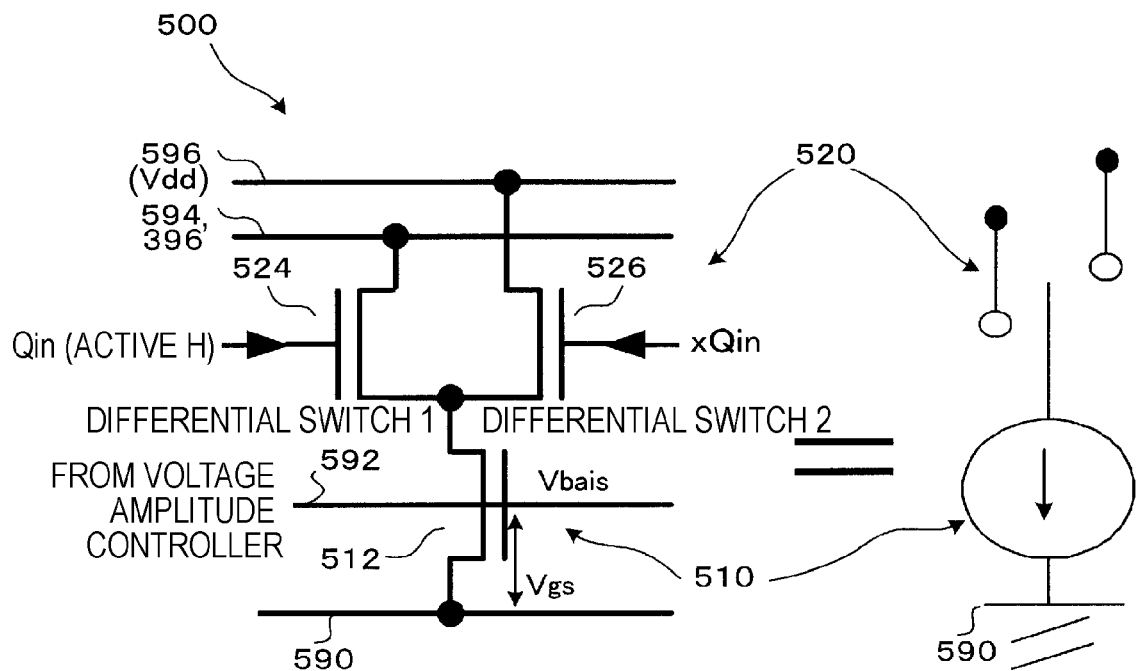
FIG. 8 is a diagram illustrating an example of a basic configuration of each current source cell provided in the current source cell section.
Figure 8B:
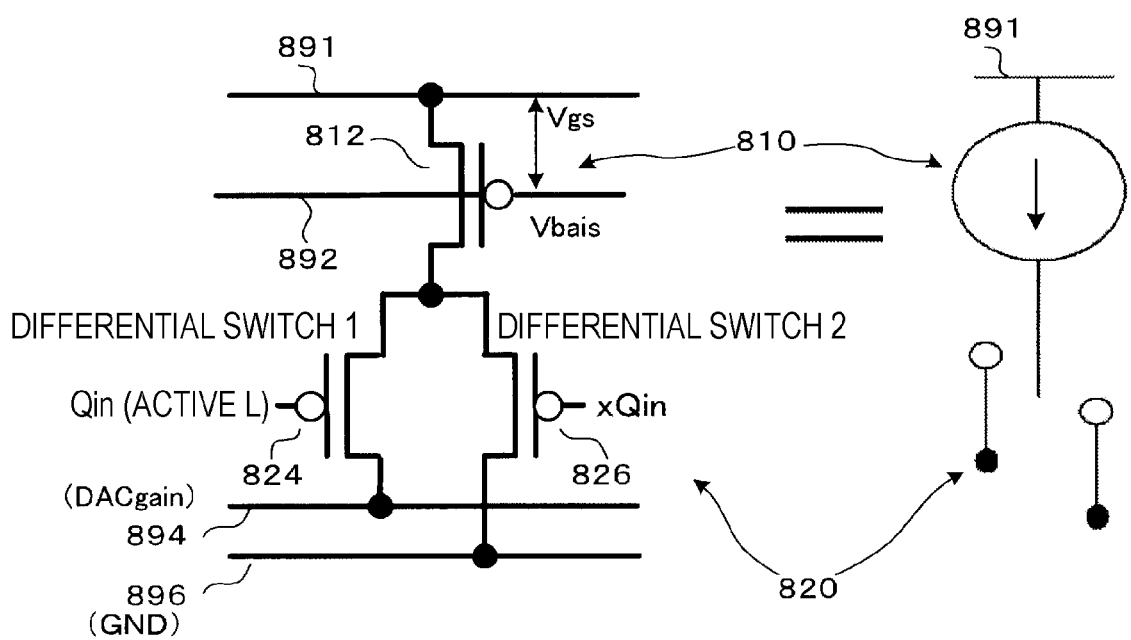

FIG. 8 is a diagram illustrating an example of a basic configuration (schematic diagram of basic current-source cell) of each current-source cell 353, 355, 753, and 755 provided in the current-source cell section 350 and 750. Here, FIG. 8A illustrates a basic current-source cell 500 corresponding to current-source cells 353 and 355, and FIG. 8B illustrates a basic current-source cell 800 corresponding to current-source cells 753 and 755.

The basic current-source cell 500 operates by receiving complementary signals in accordance with the lower-bit controller 330 and the upper-bit controller 340, which are complementarily output type.

For example, a shown in FIG. 8A, the basic current-source cell 500 has a unit current source 510 and a change switch 520 for changing the output current of the unit current source 510.

The unit current source 510 includes an NMOS transistor 512 functioning as a reference current source. Also, the change switch 520 includes two NMOS transistors 524 and 526 connected differentially. The transistor 524 functions as a differential switch 1, and the transistor 526 functions as a differential switch 2.

The source terminal of the transistor 512 is connected to the analog ground line 590, the drain terminal is commonly connected to the source terminal of the transistors 524 and 526. Also, the bias voltage Vbais, which is commonly applied to all the cells, is applied at the gate terminal of the transistor 512 from the voltage-amplitude controller 760 through the current control lint 592 in a current-mirror method, and the current value flowing through the transistor 512 depends on a voltage Vgs.

The control signals Qin and xQin (x indicates a logic inverted signal), which are complementary to each other, are input into each gate terminal of the two transistors 524 and 526 constituting the change switch 520, and lead-out lines 594 and 596 are connected to each of the drains, respectively. For example, an active-H control signal (noninverted input) Qin is input into the gate terminal of the transistor 524, the drain terminal is connected to the lead-out line 594, and the lead-out line 594 is used for the selection output line 396 for current output. At the same time, a control signal (inverted input) xQin is input into the gate terminal of the transistor 526, the drain terminal is connected to the lead-out line 596, and the lead-out line 596 is connected to the power source Vdd. On the whole, an active H is input to the selection output line 396 related to DA conversion as the control signal (noninverted input) Qin to turn on the transistor 524, and thus the current-source cell turns on.

At the same time, the basic current-source cell 800 operates by receiving complementary signals in accordance with the lower-bit controller 730 and the upper-bit controller 740, which are complementarily output type in the same manner as the basic current-source cell 500.

For example, a shown in FIG. 8B, the basic current-source cell 800 has a form produced by inverting the channels of the transistors of the basic current-source cell 500. Specifically, the basic current-source cell 800 has a unit current source 810 and a change switch 820 for changing the output current of the unit current source 810.

The unit current source 810 includes a PMOS transistor 812 functioning as a reference current source. Also, the change switch 820 includes two PMOS transistors 824 and 826 connected differentially. The transistor 824 functions as a differential switch 1, and the transistor 826 functions as a differential switch 2.

The source terminal of the transistor 812 is connected to the power source line 891, the drain terminal is commonly connected to the source terminal of the transistors 824 and 826. Also, the bias voltage Vbaisgain, which is commonly applied to all the cells, is applied at the gate terminal of the transistor 812 through the current control line 892, and the current value flowing through the transistor 812 depends on a voltage Vgs.

The control signals Qin and xQin (x indicates a logic inverted signal), which are complementary to each other, are input into each gate terminal of the two transistors 824 and 826 constituting the change switch 820, and lead-out lines 894 and 896 are connected to each of the drains, respectively. For example, an active-L control signal (noninverted input) Qin is input into the gate terminal of the transistor 824, the drain terminal is connected to the lead-out line 894, and the lead-out line 894 is used for the selection output line 796 for current output and connected to the DAC output terminal DACgain. At the same time, a control signal (inverted input) xQin is input into the gate terminal of the transistor 826, the drain terminal is connected to the lead-out line 896, and the lead-out line 896 is connected to the analog ground line 890. On the whole, an active L is input to the selection output line 796 related to DA conversion as the control signal (noninverted input) Qin to turn on the transistor 824, and thus the current-source cell turns on.

Details of Connection between the First DA Conversion Section and the Second DA Conversion Section FIG. 9 is a diagram illustrating the details of the connection between the first DA conversion section 302 and the second DA conversion section 304. As described in FIG. 4, the output side of the second DA conversion section 304 is provided with current-source cell 308, which converts the combined current added at the DAC output terminal DACgain of the second DA conversion section 304 into a voltage signal (bias voltage Vbais) and functions as a current/voltage conversion section controlling the operation current value of each of the current-source cells 353 and 355 of the first DA conversion section 302. The first DA conversion section 302 and the second DA conversion section 304 are connected in a current mirror through the gain adjustment current-source cell 308.

Each of the current-source cells 353 and 355 in the current-source cell section 350 employs the basic current-source cell 500 shown in FIG. 8A. The current-source cells 353 and 355 for generating a current value weighted for each bit are constituted by adjusting the operation current supplied to each of the cells and the number of combination thereof. Basically, a basic current source having a current value weighted by a predetermined output current is provided by adjusting the voltage to be given to the gate of the transistor 512. Then, current-source cells capable of outputting the current having a ratio of 1 to a power of two or a ratio of a power of two to 1 with respect to the gate input having that voltage in response to the basic current source are provided.

Specifically, first lower-current-source cells 353_1 having ½ current value corresponding to the ½^(j−1) frequency division clock is formed by the configuration of the basic current-source cell 500 shown in FIG. 8A itself. The value of the output current (½ current value) depends on the voltage input into the gate of the transistor 512, which is controlled by the voltage-amplitude controller 360.

The upper-current-source cell 355 having a "1" current value disposed in the upper-current-source cell section 354 is provided by disposing the two cells that are same as the lower-current-source cells 353_1. The upper-current-source cell section 354 is configured by providing i pieces of the upper-current-source cells 355 (or y pieces may be further added).

For the lower-current-source cells 353_2, . . . , 355_j weighted by ¼, . . . , ½^j, first, a current source (in particular, called a relay current-source cell) outputting the current weighted by ½^j by dividing the current into 2^(j−1) pieces with a current mirror on the basis of the output current of the lower-current-source cells 353_1 having the ½ output current. Then, the lower-current-source cells 353_2, . . . , 355_j for generating the constant currents weighted by ¼, . . . , ½^j are formed by providing, in parallel, the same number of the basic current-source cells 500, which operates at the current value of ½^j and has a configuration shown in FIG. 8a, as the corresponding predetermined number of weights. In this manner, it is possible to constitute a current-source cell outputting the currents having different weights with high precision using only the devices easy for obtaining relative ratio precision.

The relay current-source cell, the figure of which is omitted, includes, for example an NMOS transistor for supplying the same voltage to the gate of the lower-current-source cells 353_1 and the upper-current-source cell 355, which is a basic current source, two PMOS transistors disposed at the output side (drain terminal side) of this transistor and connected in a current mirror, and 2^(j−1) NMOS transistors (called the last-phase transistor) whose gate and drain disposed at one of the output sides (drain terminal side) of the PMOS transistor.

With such a configuration, the last-phase transistor of the relay current-source cell functions as a current source outputting the current weighted by ½^j. It is possible to form current branches having high precision by controlling the gate of the last-stage MOS transistors connected with each other in parallel using the same reference voltage to operate at constant current and forming branches of the current-source cells with a plurality of the last-stage transistors having the same characteristic.

Also, one of the last-phase transistors and individual transistors 512 in the lower-current-source cells 353_2, . . . , 355j are configured in a current mirror. The basic current-source cells 500 having the configuration, shown in FIG. 8A, with the transistor 512 are provided in parallel as many as the number of individual weighting current values. For example, the lower-current-source cells 353_2 outputs the current having a weight of ¼ (=½^2), the lower-current-source cells 353_3 outputs the current having a weight of ⅛ (=½^3), the lower-current-source cells 353_4 outputs the current having a weight of ¹⁄₁₆ (=½^4), and the lower-current-source cells 353_j (j=5) outputs the current having a weight of ¹⁄₃₂ (=½^5).

With this configuration, it is possible to constitute a current-source cell outputting the currents having different weights with high precision by using only the devices easy for obtaining relative ratio precision without using elements having extremely different size and shape, and without remarkably increasing the number of elements in the upper-current-source cell section 354 corresponding to the upper bits of the digital input signal. Accordingly, it is possible to improve the resolution of the DA conversion without increasing the circuit size.

Also, for the upper-current-source cell section 354, a number of cells are selected in accordance with the data value (decimal value) of the upper bits of the digital input signal. For the lower-current-source cell section 352, the cells are selected in accordance with the bit value of the lower bits of the input signal. Thus, it is possible to increase the bit resolution by adding a lower-current-source cell.

In addition, for the lower-current-source cell section 352, the basic current divided by a power of two is derived as an output current from one branch using the lower-current-source cells 353_1 which generates the current value weighted by ½ of the basic current corresponding to the digit value of a predetermined digit (in the preceding example, weight "1" of the 6th bit) and by splitting the basic current divided by a power of two (½^j) (corresponding to the transistor 532 in the preceding example). Accordingly, it is possible to obtain current-source cell having high precision using the same size element.

Also, it is possible to obtain high relative precision without being affected by the production variations, etc., by configuring the current-source cell with a constant current circuit using a MOS transistor and by configuring the current weighting of the constant current circuit by a parallel connection of a plurality of MOS transistors having the same characteristics.

In this regard, in this example, the upper-current-source cell 355 and the lower-current-source cells 353_1 are constituted by using the current-source cell outputting the current value weighted by ½ as a basic element. The operation current value of the lower-current-source cells 353_1 is divided into 2^(j−1) to form a relay current-source cell outputting the current value weighted by ½^j (in the preceding example, j=5, and thus ¹⁄₃₂). The remaining lower-current-source cells 353_2 to 355_j in the lower-current-source cell section 352 are constituted using the current-source cell outputting the current value weighted by ½^j. However, this is only an example, and any specific configuration may be used if the configuration allows to output the current weighted by the ratio of 1 to a power of two. Note that it is necessary to output currents weighted differently with high precision in the same manner as described above.

Each of the current-source cells 353 and 355 is controlled by the signal output from the inverted output terminal xQ of the D-FF 610 constituting the frequency division processing section 332 or the shift register section 342. Specifically, the inverted output terminal xQ of the D-FF 610 is input into the corresponding glitch suppression processing section 336 and 346 including the vertically connected inverters 382 and 384, and is subjected to the glitch suppression processing by receiving logic inversion and delay processing.

The glitch suppression processing section 336 and 346 supplies the selection control signal for the transistor 524 (differential switch 1) without delay by the inverter 384 and the inverted selection control signal for the transistor 526 (differential switch 2) with delay by the inverter 384 to the transistors 524 and 526 constituting differential switches.

When the control is performed on the transistors 524 and 526 operating as a differential switch of the current-source cells 353 and 355 through the glitch suppression processing section 336 and 346, the gate input to the transistor 526, which is an output of the inverter 384, is activated (a high level) or inactivated (a low level) after a delay Δt0 period, and thus in the process of the inactivation of the transistor 526 with the delay of Δt0 seconds after the activation of the transistor 524, it is possible to reliably prevent a state of turning on the transistor 524 from the off state of both of the transistors 524 and 526. Accordingly, it is possible to suppress the occurrence of glitches. This is because the output from the current-source cell passes through either switch (transistors 524 and 526) to be output.

At the same time, each of the current-source cells 753 and 755 in the current-source cell section 750 employs the basic current-source cell 800 shown in FIG. 8B. The current-source cells 753 and 755 for generating a current value weighted for each bit are constituted by adjusting the operation current supplied to each of the cells and the number of combination thereof. Basically, a basic current source having a current value weighted by a predetermined output current is provided by adjusting the voltage to be given to the gate of the transistor 812. Then, current-source cells capable of outputting the current having a ratio of 1 to a power of two or a ratio of a power of two to 1 with respect to the gate input having that voltage in response to the basic current source are provided. Such a configuration and the advantages are the same as those of the current-source cells 353 and 355 constituting the current-source cell section 350. Here, the same description will be omitted.

In this regard, it is preferable to configure each of the current-source cells 353 and 355 constituting the current-source cell section 350 of the first DA conversion section 302 and each of the current-source cells 753 and 755 constituting the current-source cell section 750 of the second DA conversion section 304 using the transistors of the same size. The reason is as follows.

That is to say, in order for the output current of the first DA conversion section 302 including NMOS current-source cells not to be influenced by the process variations and temperature, it is necessary to suppress the variations by giving the voltage created at the PMOS current-source cells in the second DA conversion section 304 to make a complementary relationship. In order to do so, it is necessary to consider the difference in the original power of an NMOS and a PMOS.

For example, first, only when the bias setting of the transistor of the first DA conversion section 302 as a slope-type DA converter including NMOS transistors is from Vgs=Vth+0.3 V to Vgs=Vth+0.7 V, the operation including the differential switch is stable (saturated). Assuming that the output current of one current-source cell of the slope-type DA conversion section (first DA conversion section 302) having Vgs=Vth+0.7 V, and the output current of the second DA conversion section 304 as the PGA section is 300 μA, the turn-back ratio becomes 10. At this time, when the power of the NMOS transistor is twice the power of the PMOS transistor, if the turn-back ratio of the slope-type DA conversion section (first DA conversion section 302) and the PGA section (second DA conversion section 304) is set to 5, a complementary relationship is established, and thus the configuration resistant to variations can be employed.

Each of the current-source cells 753 and 755 is controlled by the signal output from the inverted output terminal xQ of the decoder 732 or the decoder 742. The inverted output terminal xQ is input into the corresponding glitch suppression processing section 736 and 746 including the vertically connected inverters 382 and 384, and is subjected to the glitch suppression processing by receiving logic inversion and delay processing. The operation of the glitch suppression processing section 736 and 746 is the same as that of the glitch suppression processing section 336 and 346.

The gain adjustment current-source cell 308 functioning as the current/voltage conversion section disposed between the first DA conversion section 302 and the second DA conversion section 304 is specifically configured by the combination of parallel connections of a predetermined number (here, k) of transistors (specially called current distribution transistor/ the transistor 790 in the figure). One of the current-distribution transistors and individual transistors 512 in the lower-current-source cells 353_2, . . . , 355j are configured in a current mirror. In this manner, it is possible to divide the current Igain additionally output at the DAC output terminal DACgain of the second DA conversion section 304 into k.

With this configuration, each of the k current distribution transistors constituting the gain adjustment current-source cell 308 functions as a current source outputting the current weighted by Igain/k. It is possible to form current branches having high precision by controlling the gate of the MOS current-distribution transistors connected with each other in parallel using the same reference voltage to operate at constant current and forming branches of the current-source cells with a plurality of the current-distribution transistors having the same characteristic.

Also, one of the current-distribution transistors and individual transistors 512 in the lower-current-source cells 353_2, . . . , 355j are configured in a current mirror. The basic current-source cells 500 having the configuration, shown in FIG. 8A, with the transistor 512 are provided in parallel as many as the number of individual weighting current values.

With this configuration, it is possible to adjust the change ratio of the current and the voltage in the gain adjustment current-source cell 308 functioning as a current/voltage conversion section by adjusting the number k.

Overview of Overall Operations

Figure 10:
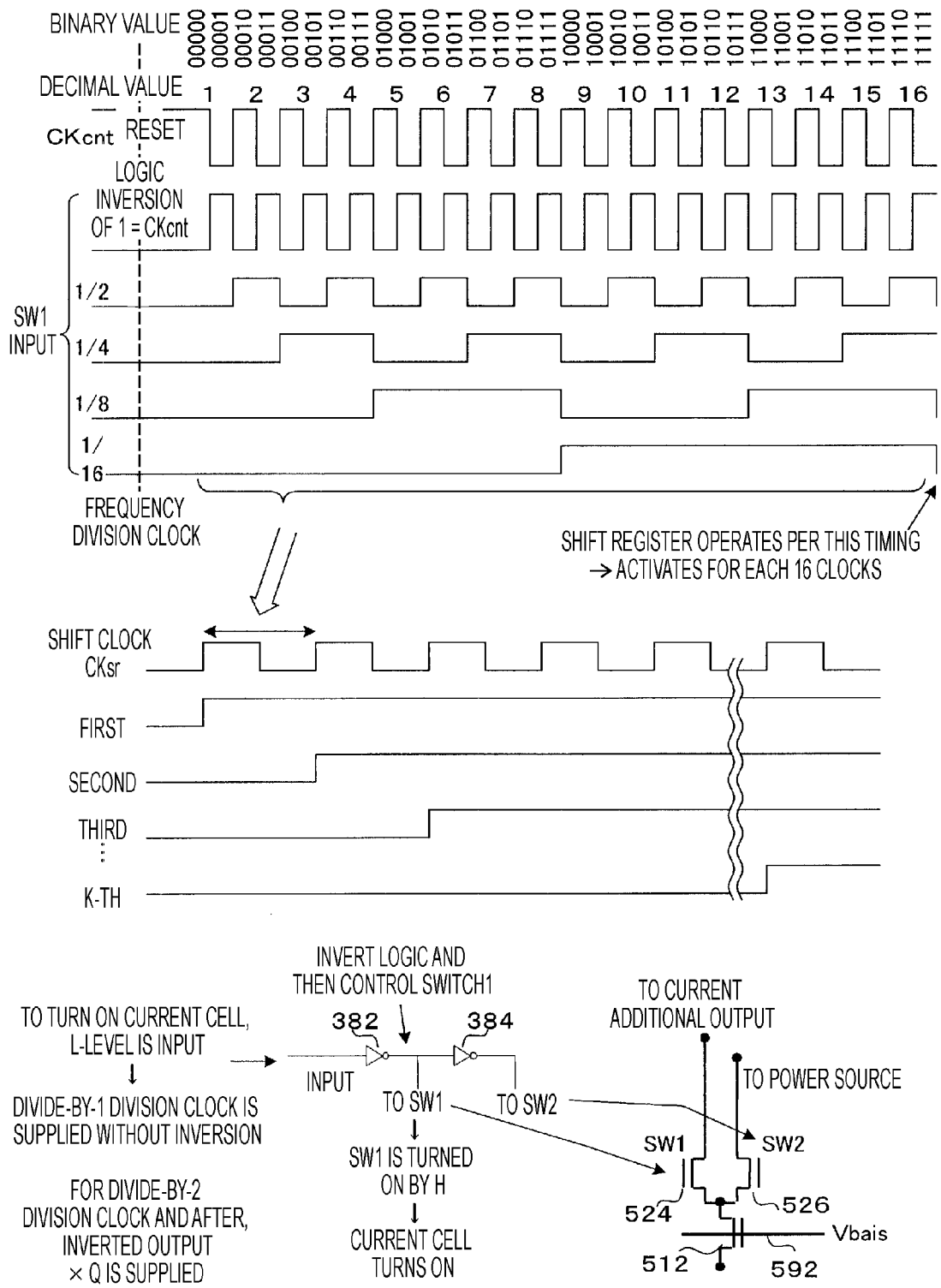
FIG. 10 is a diagram illustrating the overall operations of the DA conversion section.

FIG. 10 is a diagram illustrating of the overall operations of the above-described DA conversion section 300. Here, in particular, a description will be given of the overview of the overall operations of the first DA conversion section 302 including the lower-bit controller 330 and the upper-bit controller 340 using a timing chart. In this regard, here, a description will be given of the case where lower j-bit is 5, and 2^i pieces of upper current-source cells 355 are provided in the upper-current-source cell section 354.

It is assumed that when each output of the frequency division processing section 332 and the shift register section 342 is a low level, each of the current-source cells 353 and 355 turns on. Accordingly, at the initial value, each output of the frequency division processing section 332 and the shift register section 342 becomes an H level, and thus all the current-source cells 353 and 355 turn off.

First, the first DA conversion section 302 operates under the control of the clock count CKdac, the input digital signal Din, and the control signal J320 supplied from the communication/timing controller 20 to the block controller 320. As a preparation step, first, the block controller 320 decodes the input digital signal Din, and stops supplying the internal count clock CKcnt to the lower-bit controller 330. Also, the block controller 320 performs the output control of the DA conversion by operating the set signal and reset signal supplied to the upper-bit controller 340 and the lower-bit controller 330.

At this time, the second DA conversion section 304 performs the DA conversion processing in accordance with the input gain-setting input code Dgain, and supplies the bias voltage Vbais in accordance with the additional current in the current-source cell section 750 corresponding to the gain-setting input code Dgain to the current control line 592. Thereby, the first DA conversion section 302 generates a reference signal with a slope in accordance with the gain setting controlled by the second DA conversion section 304.

Specifically, first, in the first DA conversion section 302, the block controller 320 blocks (fixed at an H level) the internal count clock CKcnt to lower-bit controller 330. Thereby, the block controller 320 resets all the D-FFs functioning as a frequency divider in the frequency division processing section 332 and all the shift registers (actually D-FFs) in the shift register section 342.

Next, the block controller 320 supplies the internal count clock CKcnt to the lower-bit controller 330. As a result, the frequency division processing section 332 starts the count operation in synchronism with the internal count clock CKcnt. The output (noninverted output Q of D-FF 610) of each frequency divider is supplied to a glitch suppression processing section 336, is subjected to phase inversion by an inverter 382 of the glitch suppression processing section 336, and is timing controlled by an inverter 384 functioning as a delay element. Two complementary signals Q, xQ are input into differential switches (transistors 524 and 526) included in the corresponding lower-current-source cells 353, and the lower-current-source cells 353 weighted by ½^k (k changes from j to 1) turns on.

For example, first, the switching operation (L→H or H→L) of a divide-by-2^k frequency divider in the frequency division processing section 332 is performed at the rising edge of each 2^(k−1) of the input clock. One cycle thereof is completed by 2^k input clocks. This is the reason of the divide-by-2^k frequency division.

Similarly, the frequency division clock having a frequency divided by 2(j−1) by the frequency division processing section 332 is shaped into a shift clock CKsr by the shift controller 333, and then is supplied to the frequency division processing section 332 of the upper-bit controller 340, and is used for switching the lower-current-source cells 353, which is multiplied by 1 by being weighted uniformly.

Here, in the shift register section 342, a shift operation is performed using the shift clock CKsr generated on the basis of a divide-by-16 frequency division clock output from a divide-by-16 divider of the frequency division processing section 332, and thus the output of the shift register is activated in sequence for each 16 clocks. For example, with the transition of the noninverted output of the shift register to an H level, the inverted output turns to an L level, and the first upper current-source cell 355_1 turns on. Then, each time the divide-by-16 frequency division clock turns to an H level, the noninverted output of the shift register to an H level in sequence, the inverted output turns to an L level, and the corresponding kth lower current-source cell 353_k turns on. Unless the control signals J330 and J340 output a reset signal, the transition continues until the last 2^ith upper current-source cell 355_2^i turns on.

In this manner, by the coordinated operation on the basis of the lower-bit controller 330 and the internal count clock CKcnt of the upper-bit controller 340, the DA conversion section 300 functions as a DA conversion circuit reliably producing grayscales in synchronism with the internal count clock CKcnt. Thus, the DA conversion section 300 can generates the reference voltage changing in a gradually increasing direction with a slope corresponding to the gain setting determined by the second DA conversion section 304 with high precision.

In this regard, here, in order to generate the reference voltage changing in a gradually increasing direction, the selection of the current-source cells 353 and 355 are controlled in a direction in which the additional current by the current-source cells 353 and 355 selected in the current-source cell section 350 increases. However, it is possible to generate the reference voltage changing in a gradually decreasing direction by controlling the selection of the current-source cells 353 and 355 selected in the current-source cell section 350 in a direction in which the additional current by the current-source cells 353 and 355 decreases.

Example of Gain Adjustment by the Second DA Conversion Section

Figure 11A:
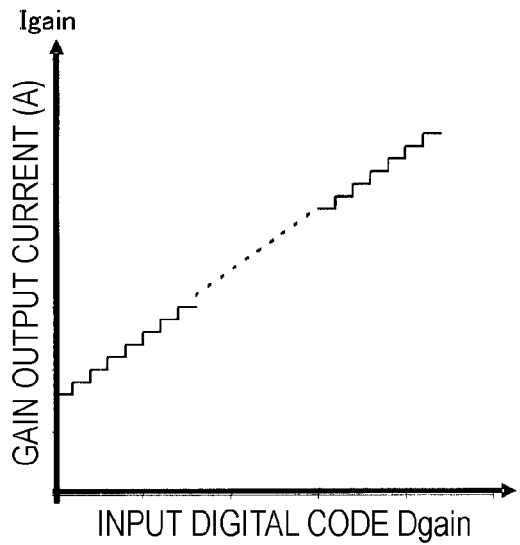
FIG. 11 is a diagram (part 1) illustrating an example of gain adjustment at the time of AD conversion processing using the second DA conversion section.
Figure 11B:
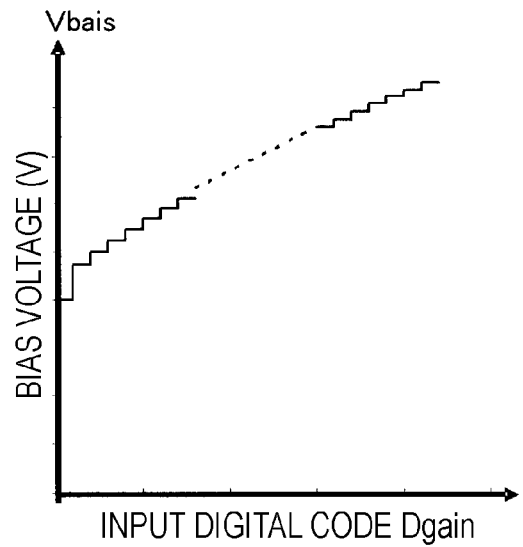
Figure 11C:
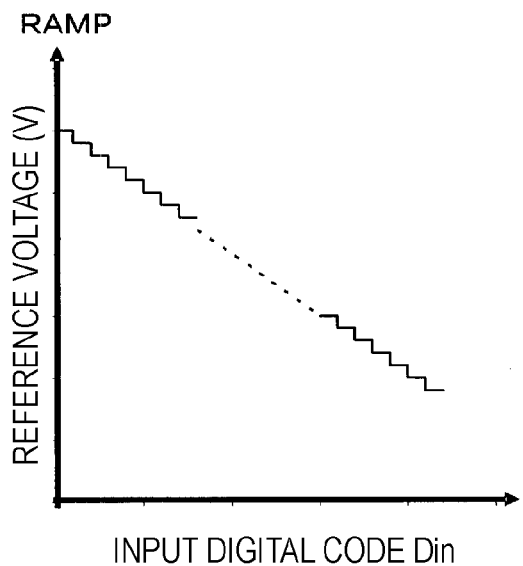
Figure 11D:
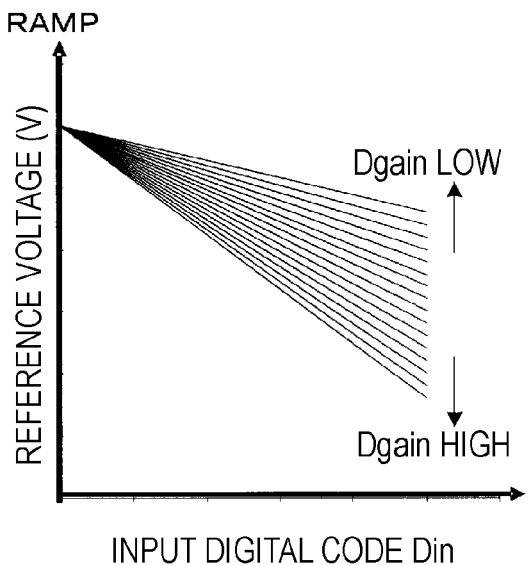
Figure 12:
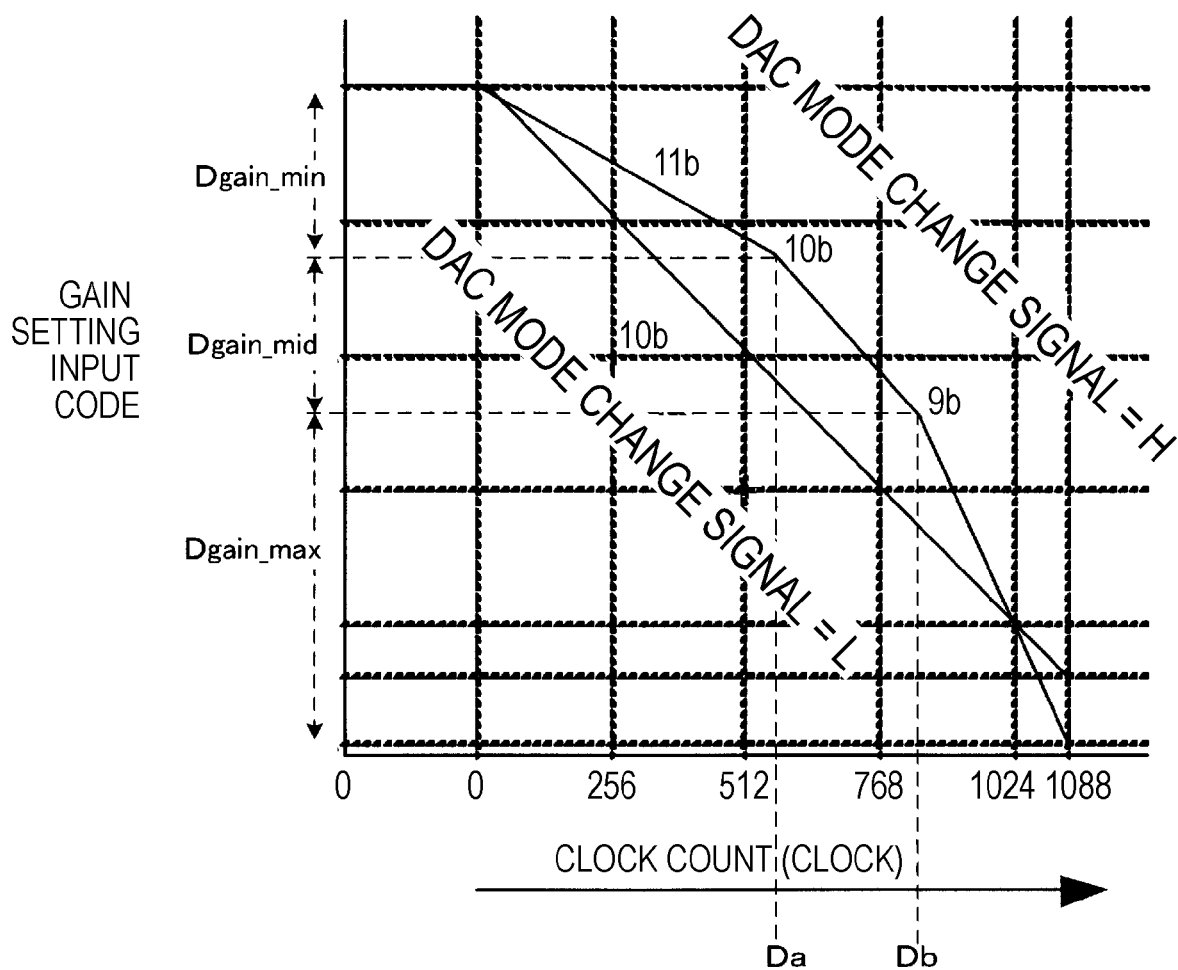
FIG. 12 is a diagram (part 2) illustrating an example of gain adjustment at the time of AD conversion processing using the second DA conversion section.

FIGS. 11 and 12 are diagrams illustrating an example of gain adjustment at the time of AD conversion processing using the second DA conversion section 304. Here, FIG. 11A is a diagram illustrating a state of the output current Igain of the second DA conversion section 304 with respect to a gain setting input code Dgain, which is the external digital input value. FIG. 11B is a diagram illustrating a state of the bias voltage Vbais output from the gain adjustment current-source cell 308 with respect to a gain setting input code Dgain, which is the external digital input value. FIG. 11C is a diagram illustrating a state of the reference voltage RAMP generated by the first DA conversion section 302 at a certain gain-setting value with respect to an input digital signal Din. Also, FIG. 11D is a diagram illustrating a state of the reference voltage RAMP when a gain setting is changes variously by the second DA conversion section 304.

Here, the output current Igain of the second DA conversion section 304, which is uniquely determined for an input n-bit value is input into the gain adjustment current-source cell 308 functioning as a current/voltage converter. Assuming that the output current of each of the current-source cells 753 and 755 (composite element corresponding to bit data for the upper current-source cell 755) is Icell_gain, the output current Igain of the second DA conversion section 304 becomes as shown in the following expression (3), which linearly changes as shown in FIG. 11A.

$$I_{gain} = \sum_{m=0}^{n-1} I_{cell\_gain} \times 2^m [A] \qquad (3)$$

When this output current Igain is supplied to a turning-back transistor 790 (or 792) constituting the gain adjustment current-source cell 308, the bias voltage Vbais is uniquely determined as shown by the following expression (4). As is understood from the expression (4), the bias voltage Vbais is proportional to √ times the output current Igain, and the voltage value that is √ times the current is output as shown in FIG. 11B.

[Expression 4]

$$V_{bias} = K\sqrt{I_{gain}} - V_{th} \qquad (4)$$

The first DA conversion section 302 operates at the operation current specified by this bias voltage Vbais. The output voltage Vout becomes as shown by the expression (5) by being specified by the product of the additional current Idac output from the first DA conversion section 302 and the resistance value Rref of a reference resistor 398 as shown by the following expression (5).

[Expression 5]

$$V_{out} = R_{ref} \times I_{dac} \qquad (5)$$

Here, the additional current Idac output from the first DA conversion section 302 is uniquely determined by the bias voltage Vbais generated by the gain adjustment current-source cell 308 on the basis of the additional current Idac output from the second DA conversion section 304. Assuming that the output current of each of the current-source cells 353 and 355 (composite element corresponding to bit data for the upper current-source cell 355) is Icell_dac, the additional current Idac becomes as shown in the following expression (6).

$$I_{dac} = \sum_{m=0}^{n-1} I_{cell\_dac} \times 2^m [A] \quad \ldots \quad (6\text{-}1)$$
$$I_{cell\_dac} = K \cdot (V_{bias} - V_{th})^2 \quad \ldots \quad (6\text{-}2)$$
(6)

As is understood from the expression (6), the additional current Idac is controlled by the bias voltage Vbais generated by the gain adjustment current-source cell 308. Furthermore, as is understood from the expression (5), the amplitude of the output voltage Vout is determined by the additional current Idac. That is to say, the gain-control bias voltage Vbais, which is the gate voltage of the current-source cells 353 and 355 of the first DA conversion section 302 is uniquely determined by the gain-setting input code Dgain and the amplitude of the output voltage Vout is uniquely determined. As a result, as shown in FIG. 11C, the slope of the reference signal RAMP is uniquely determined by the gain-setting input code Dgain supplied to the second DA conversion section 304.

Accordingly, as shown in FIG. 11D, it becomes possible to arbitrarily adjust the amplitude of the output voltage Vout, namely the slope of the reference signal RAMP changing linearly, by the second DA conversion section 304 by adjusting the gain-setting input code Dgain supplied to the second DA conversion section 304.

The change of the slope of the reference signal RAMP means the gain adjustment of the reference signal RAMP. As described before, in the single-slope integration type AD conversion processing using the reference signal RAMP, the change of the slope functions as gain adjustment on the pixel signal to be compared. Accordingly, it becomes possible to perform the gain adjustment on the pixel signal with the bit precision of gain-setting input code Dgain. For the AD conversion result of the column AD circuit 25, the digital data after having been subjected to this gain adjustment can be obtained. If the gain-setting input code Dgain is digitally controlled with high precision, it becomes possible to perform gain adjustment on the analog signal to be subjected to the AD conversion processing with high precision as a result.

In this regard, in the above description, a constant gain-setting input code Dgain is supplied to the second DA conversion section 304 during the AD conversion processing. However, if the gain-setting input code Dgain is dynamically adjusted during the AD conversion processing, it is possible to dynamically adjust the change characteristic (so-called the slope) of the DA output of the first DA conversion section 302, and thus it becomes possible to obtain the AD conversion result with γ correction.

For example, in the graphs shown in FIG. 12, when a DAC-mode-change signal, which is one of the control signals J720 supplied from the communication/timing controller 20 to the second DA conversion section 304, is an L level, a pre-decoder 720 performs the DA conversion processing on the basis of one gain-setting input code Dgain (in the figure, shown by 10b) specified by the communication/timing controller 20, and supplies the bias voltage Vbais corresponding to the gain-setting input code Dgain to the first DA conversion section 302.

On the other hand, when the DAC-mode-change signal is an H level, three gain-setting input code Dgain specified by the communication/timing controller 20 is dynamically changed during the AD conversion processing in the column AD circuit 25. For example, at first, the DA conversion processing is performed on the basis of the minimum value Dgain_min among the three gain-setting input codes Dgain_max, Dgain_mid, and Dgain_min, and the minimum bias voltage Vbais corresponding to the minimum gain-setting input code Dgain_min is supplied to the first DA conversion section 302. As a result, the DA output (namely, the reference signal RAMP) by the first DA conversion section 302 changes more slowly than the case of DAC-mode-change signal=L (the slope is gentle; on the figure, shown by 11b). When the DA output is used for the reference signal of the AD conversion, if the slope is gentle, the AD output data becomes bigger. This means that the AD conversion is performed with a higher analog gain.

Then, when the DAC code of the second DA conversion section 304 reaches a predetermined value Da, the pre-decoder 720 of the second DA conversion section 304 changes the gain-setting input code Dgain to be used to the medium value Dgain_mid. At this time, the DA output of the first DA conversion section 302 changes with the same slope (in the figure, shown by 10b) as that of time when the DAC-mode-change signal=L.

Furthermore, when the DAC code of the second DA conversion section 304 reaches a predetermined value Db, the pre-decoder 720 of the second DA conversion section 304 changes the gain-setting input code Dgain to be used to the maximum value Dgain_max. Thus, the DA output of the first DA conversion section 302 changes at a higher speed than the time when the DAC-mode-change signal=L (slope is steep; in the figure, shown by 9b). When the DA output is used for the reference signal of the AD conversion, if the slope is steep, the AD output data becomes smaller. This means that the AD conversion is performed with a low analog gain.

In this regard, in this example, the DA output (in this example, the reference signal RAMP) of the first DA conversion section 302 is changed step-by-step while keeping linearity. However, if the gain-setting input code Dgain is further divided into many steps and changed finely, for example it is possible to gradually change in succession in accordance with a high-order function such as, for example a quadratic function, etc.

Thus, for example, when imaging is performed in a dark place short of input light, for example it is possible to assure a dynamic range by adjusting such that the gain (analog gain) of the imaging signal becomes high in order to obtain digital data. On the other hand, when imaging is performed in a light place full of input light, it is possible to assure a dynamic range by adjusting such that the gain (analog gain) of the imaging signal becomes low in order to obtain digital data. Thus, it is possible to assure a dynamic range while preventing saturation. It becomes possible not only to achieve a wide dynamic range, but also to perform γ correction on the sensitivity characteristic and to achieve more natural sensor characteristics.

In the above, a description has been given of the present invention using the embodiments. However, the technical scope of the present invention is not limited to the scope of the above-described embodiment. Various modifications and improvements can be made on the above-described embodiments without departing from the spirit and scope of the invention, and those modified and improved embodiments should be included within the technical scope of the present invention.

Also, the above-described embodiments do not limit the invention as claimed. All the combination of the characteristics described in the embodiments are not necessarily indispensable for the means of solution of the invention. Inventions of various stages are included in the above-described embodiments, and thus it is possible to extract various inventions from an appropriate combination of a plurality of the disclosed components. Even if some components are deleted from all the components shown in the embodiments, as far as any effect can be obtained, it is possible to extract the configuration from which the above-described components have been deleted as an invention.

For example, the first DA conversion section 302 and the second DA conversion section 304 are only an example of specific configurations. Various configurations other than that can be employed. The slope of the reference signal generated by the first DA conversion section 302, which is to be used in an AD conversion method of a so-called single-slope integration type, should be adjusted by the digital control by the second DA conversion section 304. Various alternations are possible within this technique, and those alternations are also considered to be within the scope of the present invention.

Also, in the above-described embodiment, an AD conversion function section is disposed in the column area located at the reading side of the pixel area 10. However, that section can be disposed at the other place. For example, analog pixel signal may be output to the horizontal signal line 18, and may be subjected to the AD conversion to be passed to the output circuit 28.

Also, in the above-described embodiment, at the count processing time after the mode change, the count processing is started from the last count before the change. However, when a synchronous up-down counter which outputs a count output value in synchronism with the count clock CK0, it is not necessary to perform special handling at mode change time in order to achieve the above.

However, asynchronous up-down counter, which has an advantage in that an operation limit frequency is determined only by the limitation of the first flip-flop (counter basic element) and is suitable for high-speed operation, is used, there is a problem in that the count value is destroyed at the time of the count mode change, and that a normal count operation cannot be performed keeping the value continuously before and after the change. Thus, it is preferable to provide an adjustment processing section allowing to start the count processing from the last count before the mode change. In this regard, a description will be omitted of the details of the adjustment processing section. In this regard, when addition processing is performed between a plurality of signals, each count mode of the preceding stage and the subsequent stage should be the same, and such a measure is unnecessary.

Also, in the above-described embodiment, of the pixel signal for the same pixel signal in time series, the signal component Vsig appears after the reset component $\Delta V$ (reference component). The subsequent processing section corresponds to a positive (the greater the signal level, greater the positive value) signal. When obtaining the true signal component, the comparison processing and the down counting are performed on the reset component $\Delta V$ (reference component) for the first processing, and the comparison processing and the down counting are performed on the signal component Vsig for the second processing. However, the combination of the reference signal component and the count mode and the processing sequence are arbitrary regardless of the sequence of the reference component and the signal component in time series. The digital data obtained by the second processing might be a negative value depending on the processing sequence. In that case, sign change, correction operation, etc., should be performed.

Of course, as a device architecture of the pixel area 10, it is necessary to read the reset component $\Delta V$ (reference component) after the signal component Vsig. When the subsequent processing section corresponds to a positive signal, it is efficient to perform the comparison processing and the down counting on the signal component Vsig for the first processing, and perform the comparison processing and the down counting on the reset component $\Delta V$ (reference component) for the second processing.

Also, in the above-described embodiment, of the pixel signal for the same pixel signal in time series, the signal component Vsig appears after the reset component $\Delta V$ (reference component). When addition is performed among the pixel signals having a plurality of different storage time, the differential processing for obtaining a true signal component is performed for each pixel signal. However, when only the signal component Vsig is to be processed, for example the reset component $\Delta V$ (reference component) can be disregarded, it is possible to omit the differential processing for obtaining a true signal component.

Also, in the above-described embodiment, an up-down counter is commonly used regardless of the operation mode, and the processing modes are changed for the count processing. However, the count processing may be performed with a combination of a down-count mode and an up-count mode. Thus, the present invention is not limited to the configuration using an up-down counter capable of changing modes.

Also, in the above-described embodiment, a description has been given by taking an example of a sensor having a configuration in which unit pixels including an NMOS or a PMOS are arranged in a matrix. However, the present invention is not limited to this, and can be applied to a line sensor having one line configuration along with the same operation and advantages as those described above.

Also, in the above-described embodiment, a description has been given by taking an example of a CMOS sensor including pixel area generating signal charge by receiving light as an example of the solid-state imaging device capable of arbitrarily select a signal from individual unit pixel by address control. However, the generation of signal charge may be applied not only to light, but also to any electromagnetic wave in general, for example infrared rays, ultraviolet rays, X-rays, etc. The items described in the above embodiment can be applied to a semiconductor device including unit components on which a large number of elements outputting an analog signal in accordance with the amount of the reception of the electromagnetic wave are arranged.

Also, an AD conversion circuit described as an example in the above-described embodiment is not limited to be provided as built-in form in solid-state imaging devices and the other semiconductor device or electronic apparatuses. For example, the circuit may be provided as a stand alone device, for example an IC (Integrated Circuit), an AD conversion module, a data processing module, etc.

In this case, the AD conversion circuit may be provided as an AD converter (or data processing device) including a comparison section and a counter section. However, it is possible to provide the circuit as an IC (integrated circuit) on which the reference-signal generation section for generating a reference signal for AD conversion and supplying the signal to the comparison section and the control section for controlling the count processing mode in the counter section are disposed on the same semiconductor substrate, and a module including the combination of individual chips.

When achieving the function of generating an image signal, it becomes possible to handle the functional sections necessary for controlling the operation of the comparison section and the counter section together by providing these in a built-in form, and thus the handling and management of the members become easy. Also, the elements necessary for the AD conversion are integrated into an IC and a module, and thus it becomes easy to produce final products of solid-state imaging devices and the other semiconductor devices or electronic apparatuses.

Also, in the above-described embodiment, an example has been shown of the CMOS imaging device having sensitivity for the electromagnetic wave input from the outside, such as light, radiation rays, etc. However, the mechanism described in the above embodiment can be applied to all the devices for detecting the change of physical quantities. It is also possible to apply the above-described embodiment to, for example a fingerprint authentication apparatus (refer to Japanese Unexamined Patent Application Publication Nos. 2002-7984 and 2001-125734, etc.), which detects the information on a fingerprint on the basis of the change of the electronic characteristic based on the pressure or detects the image of a fingerprint on the basis of the change of the optical characteristics, and the other mechanism for detecting the physical change in order to use the mechanism for converting an analog signal into a digital signal.

What is claimed is:

1. A solid state imaging device comprising:
a plurality of individual pixels;
a reference signal generator for generating a reference signal;
a comparator for comparing an analog signal output from each pixel with the reference signal output from the reference signal generator;
wherein the reference signal generation includes
a first DA conversion section for providing an analog output signal in accordance with a digital input signal value and
a second DA conversion section for providing an analog gain control output signal in accordance with a digital gain control input signal, and
an output of the reference signal generated by the first DA conversion section is adjusted on the basis of the gain control output signal generated by the second DA conversion section.

* * * * *